US012787402B2

(12) United States Patent
Zhu et al.

(10) Patent No.: US 12,787,402 B2
(45) Date of Patent: Nov. 3, 2026

(54) TRANSISTORS WITH DIELECTRIC SPACERS AND METHODS OF FABRICATION THEREOF

(71) Applicant: NXP USA, Inc., Austin, TX (US)

(72) Inventors: Congyong Zhu, Gilbert, AZ (US); Philippe Renaud, Chandler, AZ (US); Darrell Glenn Hill, Chandler, AZ (US); Gregory David Hale, Chandler, AZ (US); Colby Greg Rampley, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 409 days.

(21) Appl. No.: 18/344,296

(22) Filed: Jun. 29, 2023

(65) Prior Publication Data

US 2025/0006818 A1 Jan. 2, 2025

(51) Int. Cl.
*H10D 64/01* (2025.01)
*H10D 64/00* (2025.01)
(Continued)

(52) U.S. Cl.
CPC ......... *H10D 64/021* (2025.01); *H10D 64/111* (2025.01); *H10D 84/0147* (2025.01); *H10D 84/038* (2025.01); *H10D 84/83* (2025.01)

(58) Field of Classification Search
CPC ............... H10D 64/021; H10D 64/111; H10D 84/0147; H10D 84/038; H10D 84/83;
(Continued)

(56) References Cited

U.S. PATENT DOCUMENTS

| | | | |
|---|---|---|---|
| 5,288,660 A | 2/1994 | Hua et al. | |
| 2007/0018199 A1 | 1/2007 | Sheppard et al. | |

(Continued)

FOREIGN PATENT DOCUMENTS

| | | | |
|---|---|---|---|
| CN | 107424919 A | 12/2017 | |
| CN | 112614777 A * | 4/2021 | ....... H10D 64/01328 |

(Continued)

OTHER PUBLICATIONS

U.S. Appl. No. 18/344,363, filed Jun. 29, 2023; 69 pages.
U.S. Appl. No. 17/645,280, filed Dec. 20, 2021; 36 pages.
U.S. Appl. No. 17/661,827, May 3, 2022; 69 pages.

*Primary Examiner* — Duy T Nguyen
*Assistant Examiner* — Kenneth Mark Sipling
(74) *Attorney, Agent, or Firm* — Andrew C. Milhollin

(57) ABSTRACT

A transistor device and method of fabrication are provided, where the transistor device may include a semiconductor substrate, a first dielectric layer disposed on a surface of the semiconductor substrate, a second dielectric layer disposed directly on the first dielectric layer, a gate structure disposed directly on the surface of the semiconductor substrate, and a spacer structure. A first opening through the first dielectric layer and the second dielectric layer may correspond to a gate channel. Portions of the first dielectric layer and the second dielectric layer may be interposed directly between portions of the gate structure and the surface of the semiconductor substrate. The spacer structure may be disposed in the gate channel and interposed between the gate structure and the semiconductor substrate. The spacer structure may contact respective side surfaces of the first dielectric layer and the second dielectric layer that at least partially define the gate channel.

9 Claims, 35 Drawing Sheets

(51) Int. Cl.
*H10D 84/01* (2026.01)
*H10D 84/03* (2025.01)
*H10D 84/83* (2025.01)

(58) Field of Classification Search
CPC .. H10D 30/475; H10D 64/411; H10D 30/015; H10D 62/8503; H01L 23/481
See application file for complete search history.

(56) References Cited

U.S. PATENT DOCUMENTS

| | | | | |
|---|---|---|---|---|
| 2013/0341678 | A1 | 12/2013 | Green et al. | |
| 2016/0086938 | A1 | 3/2016 | Kinzer | |
| 2021/0118995 | A1* | 4/2021 | Cheng | H10D 64/01 |
| 2021/0257475 | A1 | 8/2021 | Wong | |
| 2022/0376099 | A1 | 11/2022 | Bothe et al. | |
| 2023/0197839 | A1 | 6/2023 | Zhu et al. | |

FOREIGN PATENT DOCUMENTS

| | | | | | |
|---|---|---|---|---|---|
| CN | 115602708 | A | * | 1/2023 | H10D 30/015 |
| DE | 102022113066 | A1 | * | 12/2022 | H10D 64/512 |

* cited by examiner

TRANSISTORS WITH DIELECTRIC SPACERS AND METHODS OF FABRICATION THEREOF

TECHNICAL FIELD

Embodiments of the subject matter described herein relate generally to transistor devices, and more particularly to semiconductor power transistors dielectric spacers.

BACKGROUND

High-power field effect transistor (FET) devices find application in a wide variety of electronic components and systems. While various advances have been made to improve gain, efficiency, and other characteristics of power FETs that are used to provide amplification in radio frequency (RF) communication systems, challenges still exist for fabricating such devices. For example, fabricating FETs with short gate lengths using photolithography alone is more challenging for gallium nitride (GaN) on silicon carbide (SiC) based FETs than for silicon (Si) based FETs, due in part to transparency of SiC substrates and to lack of sufficiently uniform flatness of GaN-on-SiC substrates due to, for example, side effects of heteroepitaxy (used to grow GaN on SiC). As another example, dielectric layers exposed to multiple dry etch processes during device fabrication may experience plasma damage and etch-induced thickness variation, undesirably impacting performance and reliability.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, a transistor device includes a semiconductor substrate, a first dielectric layer disposed on a surface of the semiconductor substrate, a second dielectric layer disposed directly on the first dielectric layer, a gate structure disposed directly on the surface of the semiconductor substrate in a gate channel, and at least one dielectric spacer structure disposed in the gate channel and interposed between the gate structure and the semiconductor substrate. The gate channel is at least partially defined via a first opening that extends through the first dielectric layer and the second dielectric layer. Portions of the first dielectric layer and the second dielectric layer are interposed directly between portions of the gate structure and the surface of the semiconductor substrate. The at least one dielectric spacer structure is in direct contact with respective side surfaces of the first dielectric layer and the second dielectric layer that at least partially define the gate channel.

In one or more embodiments, the at least one dielectric spacer structure includes a first layer and a second layer. The first layer is disposed in direct contact with the respective side surfaces of the first dielectric layer and the second dielectric layer and with the surface of the semiconductor substrate. The second layer is disposed in direct contact with each of the first layer and the gate structure.

In one or more embodiments, a portion of the first layer is disposed directly between the second dielectric layer and the surface of the semiconductor substrate.

In one or more embodiments, the transistor device further includes an interlayer dielectric layer disposed over the first dielectric layer, the second dielectric layer, and the gate structure.

In one or more embodiments, the transistor device further includes a field plate disposed at least partially overlapping the interlayer dielectric layer and the gate structure, such that the interlayer dielectric layer is interposed between the gate structure and the field plate.

In one or more embodiments, the field plate extends through a second opening in the first dielectric layer, the second dielectric layer, and the interlayer dielectric layer. A field plate channel is at least partially defined by the second opening.

In one or more embodiments, the transistor device further includes a third dielectric layer disposed directly on surfaces of the interlayer dielectric layer, the first dielectric layer, and the second dielectric layer and on the surface of the semiconductor substrate, wherein the field plate is disposed directly on the third dielectric layer.

In one or more embodiments, the third dielectric layer is disposed in the field plate channel and separates the field plate from the surface of the semiconductor substrate.

In an example embodiment, a method of fabricating a transistor device includes steps of providing a semiconductor substrate, forming a first dielectric layer on the semiconductor substrate, forming a second dielectric layer on the first dielectric layer, forming a gate channel by performing a patterned dry etch to form a first opening in the second dielectric layer and performing a first wet etch to form a second opening in the first dielectric layer, forming dielectric spacer structures in the gate channel, and forming a gate structure disposed at least partially in the gate channel and in contact with surfaces of the semiconductor substrate, the second dielectric layer, and the dielectric spacer structures.

In one or more embodiments, forming the dielectric spacer structures includes forming a first layer over the semiconductor substrate and in the gate channel, forming a second layer on the first layer, and etching to remove portions of the first layer and portions of the second layer.

In one or more embodiments, the first layer comprises oxide material and the second layer comprises nitride material.

In one or more embodiments, etching to remove portions of the first layer and portions of the second layer includes performing a dry etch to remove the portions of the second layer and performing a second wet etch to remove the portions of the first layer.

In one or more embodiments, performing the patterned etches to remove portions of the first layer and portions of the second layer includes performing a dry etch to remove the portions of the second layer, forming a first patterned photoresist layer over the semiconductor substrate having a third opening overlapping the gate channel, forming a second patterned photoresist layer over the semiconductor substrate having a fourth opening overlapping the gate channel, and after forming the first patterned photoresist layer and the second patterned photoresist layer, performing a second wet etch to remove the portions of the first layer.

In one or more embodiments, the method further includes forming an interlayer dielectric layer on the gate structure and the second dielectric layer and forming a field plate over the interlayer dielectric layer, wherein at least a portion of the field plate overlaps the gate structure.

In one or more embodiments, performing the first patterned dry etch further forms a fifth opening in the second dielectric layer, performing the first wet etch further forms a sixth opening in the first dielectric layer overlapping the fifth opening to expose a surface of the semiconductor substrate, the fifth opening and the sixth opening correspond to a field plate channel, and the field plate is at least partially disposed in the field plate channel.

In one or more embodiments, forming the first layer further includes forming the first layer in the field plate channel.

In one or more embodiments, the method further includes performing a second patterned dry etch to form a seventh opening in the interlayer dielectric layer through which a portion of the first layer is exposed.

In one or more embodiments, the method further includes, before forming the field plate, performing a third wet etch to remove portions of the first layer exposed through the seventh opening and, before forming the field plate, forming a third dielectric layer disposed on surfaces of the interlayer dielectric layer and, in the field plate channel, the surface of the semiconductor substrate.

In one or more embodiments, forming the gate structure includes forming a first patterned photoresist layer over the semiconductor substrate having a third opening overlapping the gate channel, forming a second patterned photoresist layer over the semiconductor substrate having a fourth opening overlapping the gate channel, and depositing metal over the semiconductor substrate, a first portion of the metal being deposited through the third opening and the fourth opening to form the gate structure, and a second portion of the metal being deposited on surfaces of the first patterned photoresist layer.

In one or more embodiments, the method further includes removing the second portion of the metal via concurrent removal of the first patterned photoresist layer and the second patterned photoresist layer.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
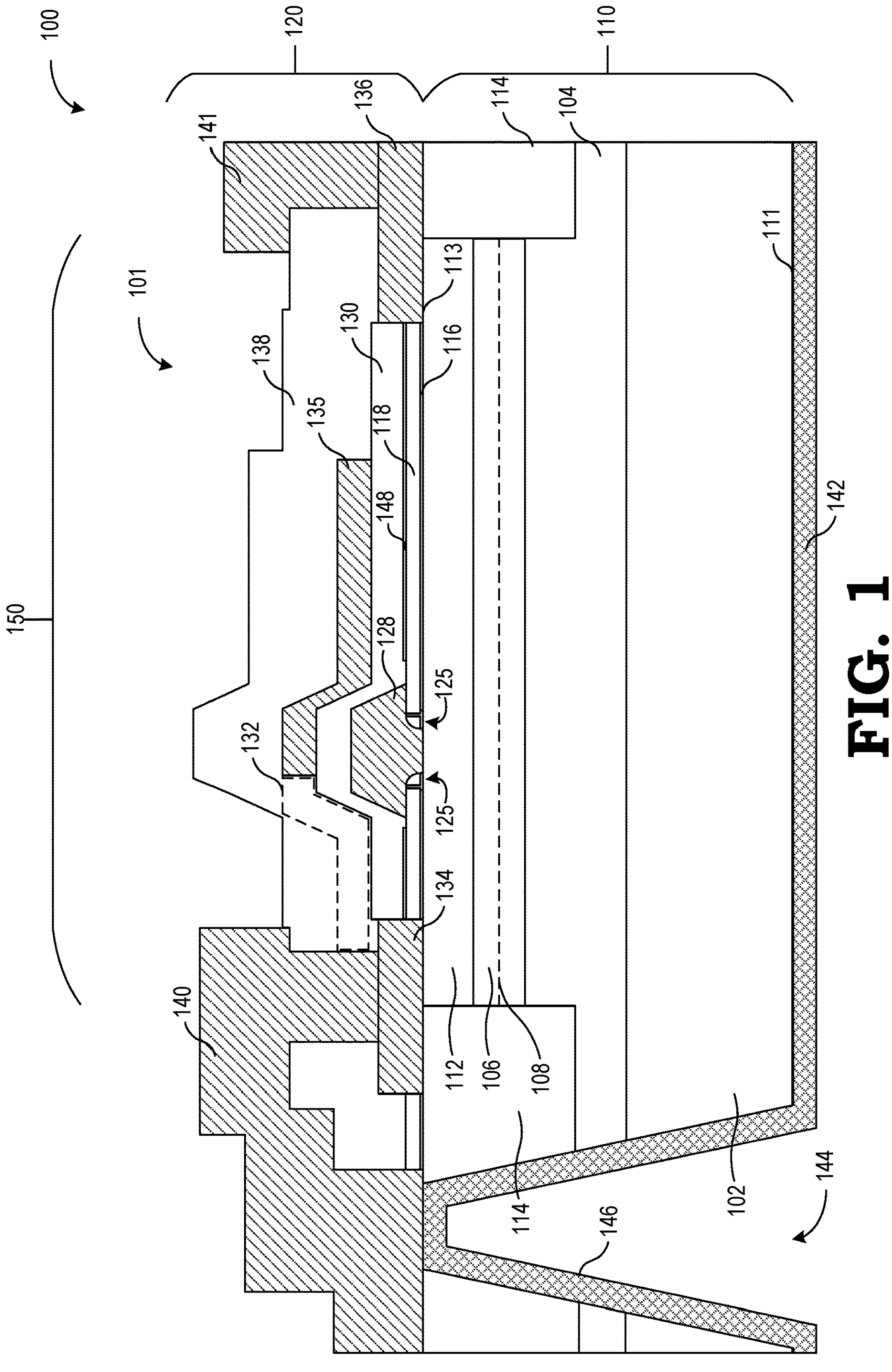
FIG. 1 is a cross-sectional side view of a transistor device, in accordance with various embodiments.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring embodiments described herein. Additionally, elements in the drawing figures are not necessarily drawn to scale. For example, the dimensions of some of the elements or regions in the figures may be exaggerated relative to other elements or regions to help improve understanding of embodiments described herein.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Various embodiments described herein relate to transistor devices and an associated fabrication methods in which one or more dielectric layers damaged by exposure to dry etching (e.g., due to plasma damage) are removed and replaced (at least in part) during the fabrication process. As will be described, the removal and replacement of dry-etch-damaged dielectric layers may result in advantageously reduce performance variation in such dielectric layers, may advantageously improve thickness uniformity of dielectric layers in the transistor device, and may advantageously reduce the incidence of charge carrier trapping at or near the surface of the semiconductor substrate.

In one or more embodiments, when fabricating a transistor device, a first dielectric layer is formed on the surface of a semiconductor substrate and a second dielectric layer is formed on the first dielectric layer. A gate channel is formed, at least in part, by first performing a patterned dry etch of the second dielectric layer during which the first dielectric layer acts as an etch stop to avoid damage to the surface of the semiconductor substrate. Portions of the first dielectric layer which are exposed (and may be damaged) during the dry etch are subsequently removed via a patterned or non-patterned wet etch. Spacer structures are then formed on the surface of the semiconductor substrate in the gate channel by forming a first spacer layer over the semiconductor substrate, forming a second spacer layer over the semiconductor substrate, performing an isotropic dry etch process to remove portions of the second spacer layer (using the first spacer layer as an etch stop), and performing a wet etch to remove portions of the first spacer layer. The first spacer layer and the second spacer layer may include dielectric materials having respectively different etch rates with respect to one or more etch processes, such as oxide materials and nitride materials as non-limiting examples. In this way, the remaining portions of the first spacer layer that are disposed under the remaining portions of the second spacer layer are not exposed to dry etch damage.

By using the first spacer layer as an etch stop when performing the dry etch of the second spacer layer, rather than the previously etched (and possibly damaged) portions of the first dielectric layer, better thickness uniformity of the dielectric material (between the second spacer layer and the semiconductor surface (in this case, the first spacer layer) may be achieved, and that thickness may be more precisely controlled. By using the first spacer layer as an etch stop when performing the dry etch of the second spacer layer, rather than the previously etched (and possibly damaged) portions of the first dielectric layer, charge carrier trapping between the dielectric material of the second spacer layer and the surface of the semiconductor substrate may be advantageously reduced.

In one or more embodiments, a field plate channel and the gate channel are formed concurrently via the dry etch and wet etch used to remove portions of the second dielectric layer and portions of the first dielectric layer, respectively. The surface of the semiconductor substrate is initially exposed through the field plate channel. Then, portions of the first spacer layer are formed directly on the surface of the semiconductor substrate in the field plate channel, thereby protecting the surface of the semiconductor substrate during subsequent dry etching of the second spacer layer. After formation of the spacer structures in the gate channel, an electrically conductive gate structure is formed via deposition of gate metal in and around the gate channel. After formation of the gate structure, an interlayer dielectric (ILD) layer is formed over the gate structure, the second dielectric layer, and on the portions of the first spacer layer disposed in the field plate channel. A patterned dry etch is performed to form an opening in the ILD layer overlapping the field plate channel, with the portions of the first spacer layer disposed in the field plate channel acting as an etch stop for the patterned dry etch of the ILD layer.

In one or more embodiments, a wet etch is then performed to remove portions of the first spacer layer disposed in the field plate channel and exposed through the opening in the ILD layer (these portions having been damaged during the patterned dry etch of the ILD layer), thereby exposing the surface of the semiconductor substrate. A third dielectric layer is then formed over the ILD layer and on the surface of the semiconductor substrate exposed in the field plate channel. An electrically conductive field plate is then formed on the third dielectric layer, with at least a portion of the field plate being disposed in the field plate channel. By using the first spacer layer as an etch stop when performing the dry etch of the second spacer layer, then removing the possibly damaged portions of the first spacer layer in the field plate channel and depositing the third dielectric layer, better thickness uniformity of the dielectric material (in this case, the third dielectric layer) between the field plate metal and the semiconductor surface may be achieved, and that thickness may be more precisely controlled.

In one or more other embodiments, the portions of the first spacer layer in the field plate channel are not removed, and the field plate is instead formed directly on portions of the ILD layer and on the portions of the first spacer layer disposed in the field plate channel.

FIG. 1 is a cross sectional side view of a transistor device 100 in accordance with one or more embodiments. The transistor device 100 may be formed on a semiconductor die having a base semiconductor substrate 110 (sometimes referred to herein as the "substrate 110") and an overlying build-up structure 120. The substrate 110 is defined by an upper surface 113 and a lower surface 111, along with side walls that extend between the lower and upper substrate surfaces 111, 113. Multiple additional electrical structures, patterned conductive layers, and dielectric layers are included in the build-up structure 120, which is disposed in direct contact with and overlies the upper surface 113 of the substrate 110.

In one or more embodiments, an active region 150 is defined corresponding to a portion of the substrate 110 and an overlying portion of the build-up structure 120. One or more isolation regions 114 may be included within the substrate 110 at the upper surface 113. The active region 150 may include portions of the substrate 110 extending between at least two of the isolation regions 114.

In one or more embodiments, the semiconductor substrate 110 may include a host semiconductor substrate 102 (sometimes referred to herein as the "host substrate 102") and multiple layers overlying the host substrate 102. In one or more embodiments, the layers overlying the host substrate 102 may include a buffer layer 104, a channel layer 106, and a barrier layer 112, all of which are described in more detail, below.

In one or more embodiments, the build-up structure 120 is formed on and over the upper surface 113 of the substrate 110 and includes various electrical structures (e.g., a gate electrode 128, ohmic contact structures 134, 136), dielectric layers (e.g., dielectric layers 116, 118, 130, 138) and dielectric structures (e.g., spacer structures 125), and patterned conductive layers (e.g., a field plate 135, interconnect layers 140, 141).

In one or more embodiments, a backside metal layer 142 is formed on the lower surface 111 of the substrate 110. The backside metal layer 142 may be electrically connected to conductive material 146 (i.e., electrically conductive material) formed in a through substrate via (TSV) 144, which electrically connects the backside metal layer 142 to the interconnect layer 140 at the upper surface 113 of the substrate 110.

A transistor 101 is formed in the active region 150 of the transistor device 100. In one or more embodiments, the transistor 101 is a field effect transistor (FET), which includes a gate electrode 128 (sometimes referred to herein as the "control electrode 128" or "gate structure 128"), a first ohmic contact structure 134 (sometimes referred to as the "source electrode 134" or "current-carrying electrode" 134) proximate to but spaced apart from a first sidewall of the gate electrode 128, and a second ohmic contact structure 136 (sometimes referred to as the "drain electrode 136" or "current-carrying electrode 136") proximate to but spaced apart from a second sidewall of the gate electrode 128, each of which are disposed at the upper surface 113 of the substrate 110 and are formed in the build-up structure 120 overlying the substrate 110. In one or more embodiments, the transistor 101 is a high electron mobility transistor (HEMT). In one or more embodiments, the transistor 101 is a gallium nitride (GaN) HEMT. It should be understood that these are non-limiting examples, and that the transistor 101 may be another suitable type of transistor in accordance with one or more other embodiments.

The ohmic contact structures 134, 136 are formed at and over the upper surface 113 of the substrate 110. In one or more embodiments, respective interfaces between the ohmic contact structures 134, 136 and respective portions the substrate 110 correspond to non-rectifying low resistance junctions (i.e., "ohmic contacts") through which electrical current may be readily conducted between semiconductor material of the substrate 110 and conductive material of the ohmic contact structures 134, 136. For example, the ohmic contact structures 134, 136 may be formed substantially in-plane with respect to one another, and both of the source electrode 134 and the drain electrode 136 may extend through at least dielectric layers 116, 118 (sometimes referred to herein as the "first dielectric layer 116" and the "second dielectric layer 118", respectively) to directly contact the upper surface 113 of the substrate 110. Additionally, the ohmic contact structures 134, 136 may be respectively electrically coupled to opposite ends of a channel 108 that is disposed within the channel layer 106 of the substrate 110. The first ohmic contact structure 134 may be electrically coupled to the TSV 144 and the backside metal layer 142 through patterned portions of one or more of the interconnect metal layers (e.g., interconnect layer 140) of the build-up structure 120. The second ohmic contact structure 136 may be electrically coupled to an output (not shown) of the transistor device 100 via the interconnect layer 141, for example.

The gate electrode 128 may be a metallic structure that is electromagnetically coupled to the channel 108 in one or more embodiments. In one or more embodiments, the gate electrode 128 includes metallic material, such as gold, nickel, copper, tungsten, or any suitable combination of these, as non-limiting examples. In one or more other embodiments, the gate electrode 128 includes non-metallic material, such as suitably-doped polysilicon as a non-limiting example. According to an embodiment, the gate electrode 128 extends through at least the first dielectric layer 116 and the second dielectric layer 118, and between spacer structures 125 to contact the upper surface 113 of the substrate 110 between the ohmic contact structures 134, 136. An opening in the first and second dielectric layers 116, 118, which is at least partially defined by the spacer structures 125, through which portions of the gate electrode 128 are formed is sometimes referred to as the "gate channel" herein. The region of the build-up structure 120 at which the gate electrode 128 is formed is sometimes referred to as the "gate channel region" herein. In one or more embodiments, the interface at which the gate electrode 128 makes contact with the substrate 110 is a Schottky contact.

In one or more embodiments, the build-up structure 120 includes the dielectric layers 116, 118, disposed over the upper surface 113 of the substrate 110, the pair of dielectric structures 125 disposed in the gate channel and in direct contact with sidewalls of the dielectric layer 116 and the dielectric layer 118, an interlayer dielectric (ILD) layer 130 formed on portions of the gate electrode 128 and the dielectric layer 118, a field plate 135 formed on portions of the ILD layer 130 (overlapping portions of the gate electrode 128), and a dielectric layer 138 formed over portions of the field plate 135 and the ILD layer 130. The dielectric spacer structures 125 may each be formed from a first spacer layer and a second spacer layer, respectively, with the first spacer layer being disposed in direct contact with the surface 113 of the substrate 110 and side walls of the dielectric layers 116, 118, and with the second spacer layer being disposed on surfaces of the first spacer layer and in direct contact with the gate electrode 128. Herein, a "side wall" or "side surface" of a given layer or structure refers to a surface that is substantially non-parallel (e.g., within around 45 degrees of being orthogonal or normal) with respect to the plane of the surface 113 of the substrate 110. As mentioned above, the gate electrode 128 may extend through openings in the dielectric layers 116, 118, and between the spacer structures 125. Each of the gate electrode 128 and the ohmic contact structures 134, 136 contact the upper surface 113 of the substrate 110 at various points directly above the channel 108. In one or more embodiments, the first dielectric layer 116 may have a thickness in a range of around 30 Angstroms to around 1,500 Angstroms, and the second dielectric layer 118 may have a thickness in a range of around 100 to around 4,000 Angstroms, although other suitable thickness values may be used. Herein, a value is considered to be "about" or "approximately" equal to a stated number if it is within +/−10% of that number, unless stated otherwise.

In one or more embodiments, the dielectric layers 116, 118, and the first and second spacer layers of the dielectric spacer structures 125 are formed from respective dielectric materials, such as aluminum oxide ($Al_2O_3$), silicon nitride (SiN; sometimes given as $Si_3N_4$), silicon oxide ($SiO_2$), silicon oxynitride (SiON), aluminum nitride (AlN), silicon aluminum nitride (SiAlN), hafnium oxide ($HfO_2$), zirconium oxide ($ZrO_2$), titanium oxide ($TiO_2$), or other suitable dielectric materials. In one or more embodiments, the first dielectric layer 116 may be separately etchable with respect to the second dielectric layer 118 with respect to one or more etch processes (e.g., wet chemical etch processes, such as a buffered oxide etch (BOE) or a phosphoric acid etch, or dry etch processes, such as a reactive ion etch (RIE) or other suitable plasma etch processes, as non-limiting examples). For example, the first dielectric layer 116 and the first spacer layer of the spacer structures 125 may each be formed from the same first dielectric material (e.g., oxide material, such as aluminum oxide (AlOx)) and the second dielectric layer 118 and the second spacer layer of the spacer structures 125 may each be formed from the same second dielectric material (e.g., nitride material, such as silicon nitride (SiNx)) that is separately etchable with respect to the first dielectric material. In one or more other embodiments, the first dielectric layer 116 and the first spacer layer of the spacer structures 125 may be formed from respectively different dielectric materials (e.g., different oxide materials). In one or more other embodiments, the second dielectric layer 118 and the second spacer layer of the spacer structures 125 may be formed from respectively different dielectric materials (e.g., different nitride materials). For example, the first dielectric layer 116 may be formed from oxide (e.g., $SiO_2$, $ZrO_2$, $HfO_2$, $Al_2O_3$, or $TiO_2$ as non-limiting examples), the second dielectric layer 118 may be formed from nitride (e.g., SiN, AlN, SiAlN as non-limiting examples), the first spacer layer of the spacer structures 125 may be formed from an oxide material (e.g., $SiO_2$, $ZrO_2$. $HfO_2$. $Al_2O_3$, or $TiO_2$ as non-limiting examples), and the second spacer layer of the spacer structures 125 may be formed from a nitride material (e.g., SiN, AlN, SiAlN as non-limiting examples). Herein, two given materials are considered to be "separately etchable" with respect to a given etch process if the etch rate of a first material of the two materials is significantly greater (e.g., around 1.5 times as great or greater) than the etch rate of the second material of the two materials with respect to the given etch process.

In one or more embodiments, the dielectric layers 116, 118 and the first and second spacer layers of the dielectric spacer structures 125 are formed over the substrate 110 using respective chemical vapor deposition processes, such as low-pressure chemical vapor deposition (LPCVD), plasma enhanced chemical vapor deposition (PECVD), or atomic layer deposition (ALD). For example, in one or more embodiments, the first dielectric layer 116 may be $AlO_x$ formed using an ALD process. In one or more embodiments, the second dielectric layer 118 may be SiNx formed using a PECVD process.

The spacer structures 125 may be disposed in the gate channel in which a portion of the gate electrode 128 is formed. For example, the spacer structures 125 may be disposed on the surface 113 of the substrate 110 in the gate channel. Side walls of the first dielectric layer 116 and the second dielectric layer 118 may define side walls of the gate channel. As will be described, the spacer structures 125 may reduce the gate length of the gate electrode 128 (e.g., to a gate length that is smaller than that achievable by conventional photolithographic equipment and techniques). Additionally, by controlling the size of the spacer structures 125, the gate length of the gate electrode 128 may be selectively adjusted.

The field plate 135 may be formed from portions of a first conductive layer that overlaps the gate electrode 128, portions of the dielectric layers 116, 118, and portions of the ILD layer 130. At various points above the channel 108 (along a dimension extending directly into the plane of FIG. 1, straps of conductive material (not shown in the presently illustrated cross-section) are formed in a region 132 to electrically connect the field plate 135 to the interconnect layer 140. At other points above the channel 108, dielectric material from the dielectric layer 138 may instead be formed in the region 132, as shown in the example of FIG. 1. The straps of conductive material formed in the region 132 (in conjunction with the interconnect layer 140) electrically couple the field plate 135 to the source electrode 134 and the conductive material 146 of the TSV 144 (e.g., electrically coupling the field plate 135 to a ground or reference potential for instances in which the backside metal 142 is coupled to or otherwise configured to provide an electrical ground or reference potential).

The field plate 135 may be formed from one or more electrically conductive materials, such as titanium tungsten (TiW), titanium tungsten nitride (TiWN), tungsten silicide (WSi), as non-limiting examples. In one or more embodiments, at least some portions of the field plate 135 overlie the gate electrode 128, and thus are proximate to one or more side walls and the upper surface of the gate electrode 128, with portions of the ILD layer 130 being disposed directly between the field plate 135 and the gate electrode 128.

Figure 2:
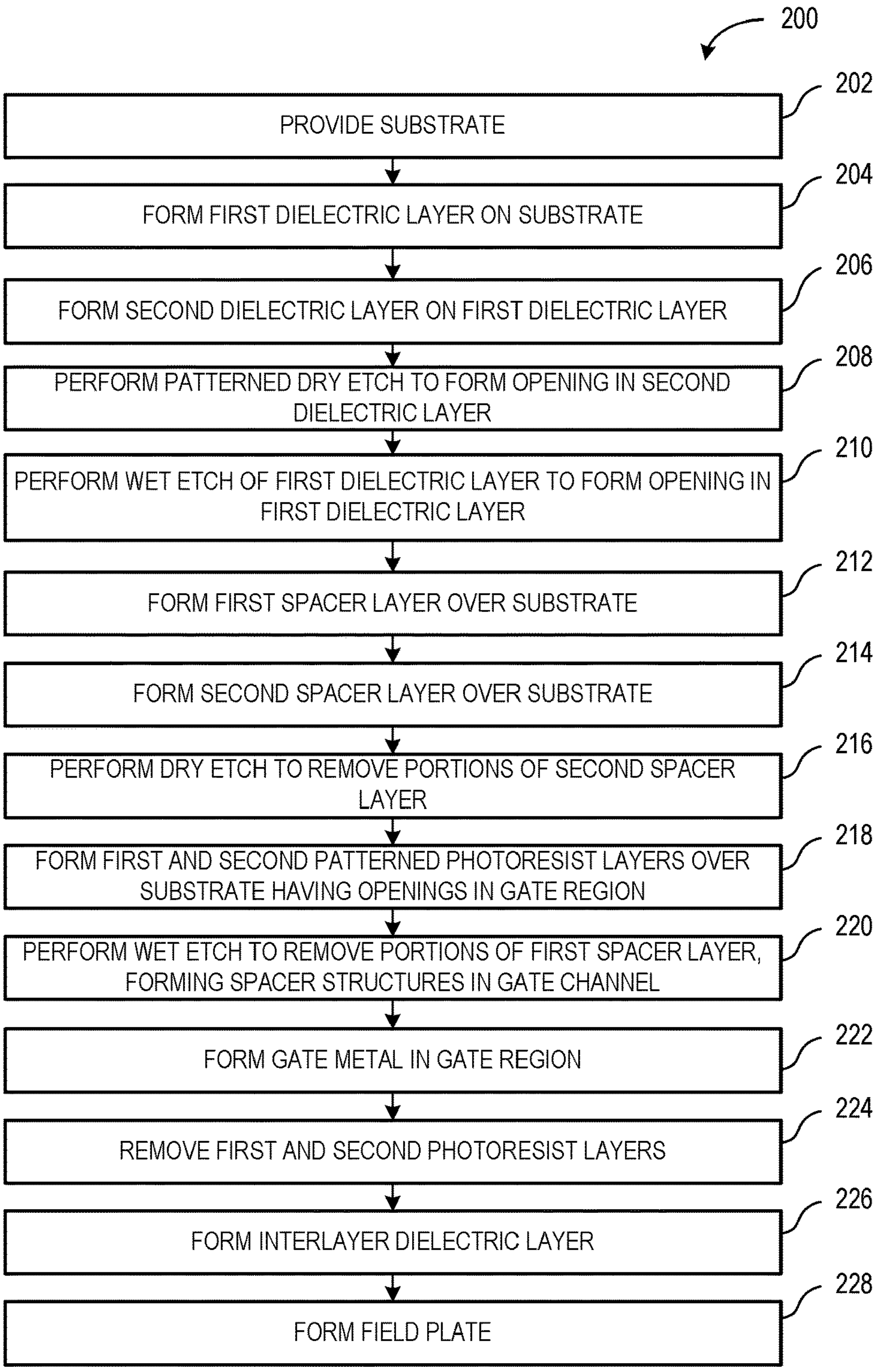
FIG. 2 is a process flow diagrams describing a method for fabricating the transistor device of FIG. 1, in accordance with various embodiments.

FIG. 2 is a process flow diagram depicting a method for fabricating at least a portion of a transistor device, such as the transistor device 100 of FIG. 1, in accordance with various embodiments. For enhanced understanding. FIG. 2 may be viewed simultaneously with FIGS. 3-16, which are cross sectional views depicting the transistor device 100 of FIG. 1 at various stages of fabrication in accordance with various embodiments.

Figure 3:
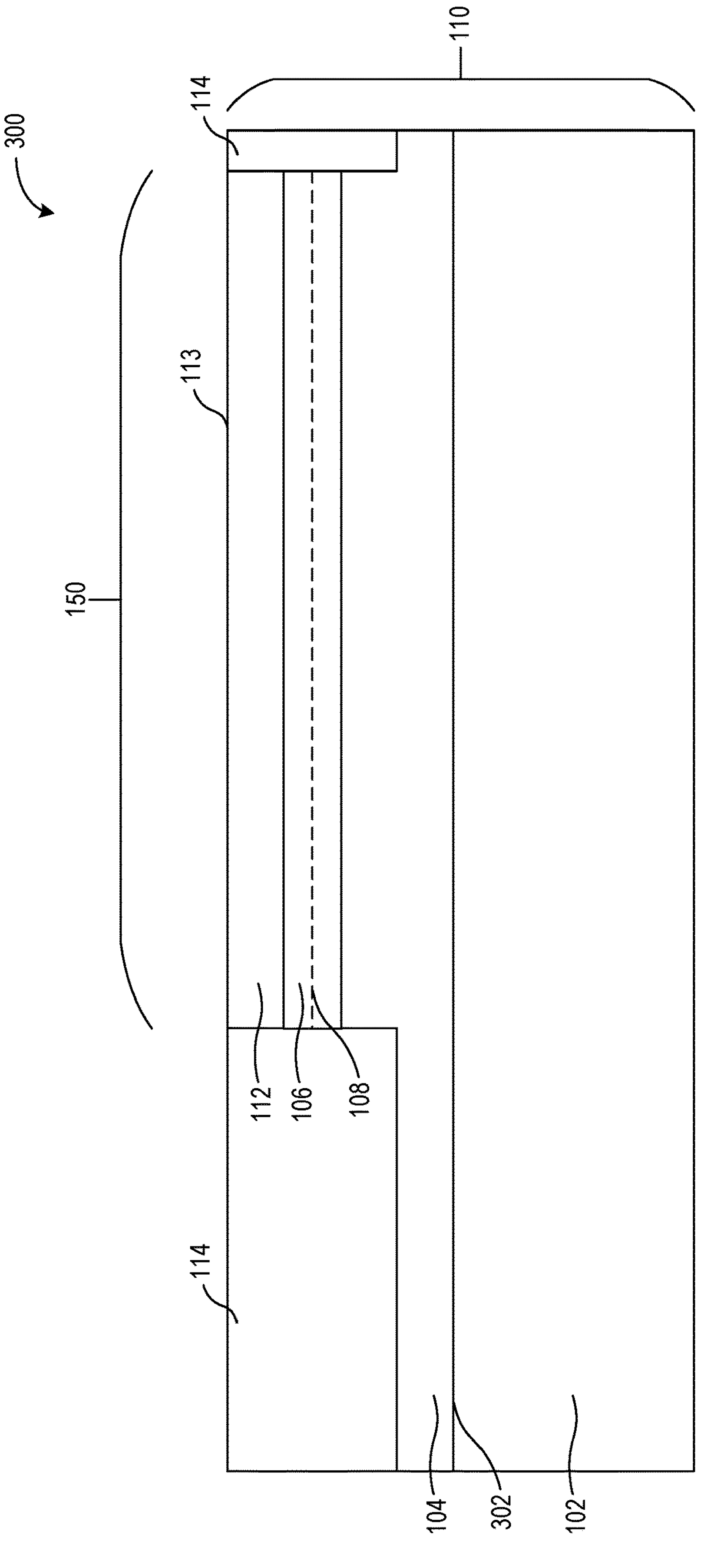
FIGS. 3-16 are cross-sectional views depicting the transistor devices of FIG. 1 at various stages of fabrication, in accordance with various embodiments.

Referring first to step 202 of FIG. 2 and to FIG. 3, at a first stage of fabrication 300, a semiconductor substrate 110 is provided, and an active region 150 is defined in the semiconductor substrate 110. As mentioned previously, the semiconductor substrate 110 may include a host semiconductor substrate 102 (sometimes referred to as the "host substrate 102") and multiple layers overlying the host substrate 102. In one or more embodiments, the layers overlying the host substrate 102 include a buffer layer 104, a channel layer 106, and a barrier layer 112.

In one or more embodiments, the host substrate 102 includes an upper surface 302 and may be formed from silicon carbide (SiC). In one or more other embodiments, the host substrate 102 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials.

The buffer layer 104 may be formed on the upper surface 302 of host substrate 102. The buffer layer 104 may include one or more group III-nitride semiconductor layers. In one or more embodiments, the buffer layer 104 includes multiple layers of semiconductor material, where each of the layers of buffer layer 104 may include an epitaxially grown group-III nitride layer, for example. In such embodiments, the epitaxially grown group-III nitride layers of the buffer layer 104 may include nitrogen (N)-polar (i.e., N-face) or gallium (Ga)-polar (i.e., Ga-face) material, for example. In one or more other embodiments, the semiconductor layer(s) of the buffer layer 104 may not be epitaxially grown. In still other embodiments, the semiconductor layer(s) of the buffer layer 104 may include Si, GaAs, InP, or other suitable materials.

In one or more embodiments, the buffer layer 104 may include at least one AlGaN mixed crystal layer having a composition denoted by $Al_XGa_{1-X}N$ with an aluminum mole fraction, X, that can take on values between 0 and 1. The total thickness of buffer layer 104, including all of its constituent layers, may be between about 100 Angstroms and about 100,000 Angstroms although other thicknesses may be used. A limiting X value of 0 yields pure GaN while a value of 1 yields pure aluminum nitride (AlN). In one or more embodiments, the buffer layer 104 may include a nucleation region comprised of AlN. The nucleation region starts at the interface between the host substrate 102 and buffer layer 104 and may extend about 100 Angstroms to about 1,000 Angstroms into buffer layer 104. The buffer layer 104 may include additional $Al_XGa_{1-X}N$ layers formed over the nucleation region. The thickness of the additional $Al_XGa_{1-X}N$ layer(s) may be between about 100 Angstroms and about 50,000 Angstroms though other thicknesses may be used. In one or more embodiments, the additional $Al_XGa_{1-X}N$ layer(s) may be configured as GaN layer(s) (X=0) where the $Al_XGa_{1-X}N$ layer(s) are not intentionally doped (NID). Alternatively, the additional $Al_XGa_{1-X}N$ layer (s) may be configured as one or more GaN layers where the one or more GaN layers are intentionally doped with dopants that may include iron (Fe), chromium (Cr), carbon (C) or other suitable dopants that render buffer layer 104 substantially insulating or highly resistive. The dopant concentration may be between about $10^{17}$ $cm^{-3}$ and $10^{19}$ $cm^{-3}$ though other higher or lower concentrations may be used. The additional $Al_XGa_{1-X}N$ layers may be configured with X=0.01 to 0.10 where the $Al_XGa_{1X}N$ is NID or, alternatively, where the $Al_XGa_{1-X}N$ is intentionally doped with Fe, Cr, C, a combination of these, or other suitable dopant species. In one or more other embodiments, the additional $Al_XGa_{1-X}N$ layers may be configured as a superlattice where the additional $Al_XGa_{1-X}N$ layers include a series of alternating NID or doped $Al_XGa_{1-X}N$ layers where the value of X takes a value between 0 and 1. In still other embodiments, buffer layer 104 may include one or more indium gallium nitride (InGaN) layers, with composition denoted $In_YGa_{1-Y}N$, where Y, the indium mole fraction, may take a value between 0 and 1. The thickness of the InGaN layer(s) may be between about 10 Angstroms and about 1,000 Angstroms though other thicknesses may be used.

In one or more embodiments, the channel layer 106 may be formed over buffer layer 104. The channel layer 106 may include one or more group III-nitride semiconductor layers. The channel layer 106 may include an $Al_XGa_{1-X}N$ layer where X takes on values between 0 and 1. In one or more embodiments, the channel layer 106 is configured as GaN (X=0) although other values of X may be used. The thickness of the channel layer 106 may be between about 50 Angstroms and about 10,000 Angstroms, though other thicknesses may be used. The channel layer 106 may be NID or, alternatively, may include Si, Ge, C, Fe, Cr, or other suitable dopants. The dopant concentration may be between about $10^{16}$ and about $10^{19}$ $cm^{-3}$ though other higher or lower concentrations may be used. In other embodiments, channel layer 106 may include NID or doped $In_YGa_{1-Y}N$, where Y, the indium mole fraction, may take a value between 0 and 1.

The barrier layer 112 may be formed over the channel layer 106, in accordance with one or more embodiments. The barrier layer 112 may include one or more group III-N semiconductor layers. The barrier layer 112 may have a larger bandgap and/or larger spontaneous polarization than the channel layer 106 and, when the barrier layer 112 is over channel layer 106, the channel 108 may be created in the form of a two-dimensional electron gas (2-DEG) within channel layer 106 adjacent the interface between the channel layer 106 and the barrier layer 112. In addition, tensile strain between the barrier layer 112 and channel layer 106 may cause additional piezoelectric charge to be introduced into the 2-DEG and the channel 108. The barrier layer 112 may include a multi-layer structure, where the first layer of the barrier layer 112 may include at least one NID $Al_XGa_{1-X}N$ layer where X takes on values between 0 and 1. In one or more embodiments, X may take a value of 0.1 to 0.35, although other values of X may be used. The thickness of the first layer of the barrier layer 112 may be between about 50 Angstroms and about 1,000 Angstroms though other thicknesses may be used. The barrier layer 112 may be NID or, alternatively, may include Si, Ge, C, Fe, Cr, or other suitable dopants. The dopant concentration may be between about $10^{16}$ and $10^{19}$ $cm^{-3}$ though other higher or lower concentrations may be used.

An additional AlN interbarrier layer (not shown) may be formed between the channel layer 106 and the barrier layer 112, in one or more embodiments. The AlN interbarrier layer may introduce additional spontaneous and piezoelectric polarization, increasing the channel charge and improving the electron confinement of the resultant 2-DEG that forms the channel 108.

In other embodiments, the barrier layer 112 may include one or more indium aluminum nitride (InAlN) layers, denoted $In_YAl_{1-Y}N$, where Y, the indium mole fraction, may take a value between about 0.1 and about 0.2 though other values of Y may be used. In the case of using InAlN to form the barrier layer 112, the thickness of the barrier layer 112 may be between about 50 Angstroms and about 1,000 Angstroms though other thicknesses may be used. In the case of using InAlN to form the barrier layer 112, the InAlN may be NID or, alternatively, may include Si, Ge, C, Fe, Cr, or other suitable dopants. The dopant concentration may be between about $10^{16}$ $cm^{-3}$ and about $10^{19}$ $cm^{-3}$ though other higher or lower concentrations may be used.

In one or more embodiments, a cap layer (not shown) may be formed over the barrier layer 112. When included, the cap layer presents a stable surface for the substrate 110 and serves to protect the upper surface 113 of the substrate 110 from chemical and environmental exposure incidental to wafer processing. The cap layer may include one or more group III-N semiconductor layers and is supported by the barrier layer 112. In one or more embodiments, the cap layer includes GaN. The thickness of the cap layer may be between about 5 Angstroms and about 100 Angstroms though other thicknesses may be used. The cap layer may be NID or, alternatively, may include Si, Ge, C, Fe, Cr, or other suitable dopants. The dopant concentration may be between about $10^{16}$ $cm^{-3}$ and $10^{19}$ $cm^{-3}$ though other higher or lower concentrations may be used.

The isolation regions 114 may be formed via an implantation procedure configured to damage the epitaxial and/or other semiconductor layers to create high resistivity regions of the substrate 110, rendering the substrate 110 high resistivity or semi-insulating in the high resistivity regions while leaving the crystal structure intact in the active region 150. In other embodiments (not shown), one or more of the isolation regions 114 may be formed by removing portions of one or more of the epitaxial and/or other semiconductor layers of the substrate 110 and leaving behind active region "mesas", such as the active region 150, surrounded by the isolation regions 114 (i.e., surrounded by regions of high resistivity or semi-insulating material). The transistor 101 of FIG. 1 may subsequently be formed within the active region 150.

Figure 4:
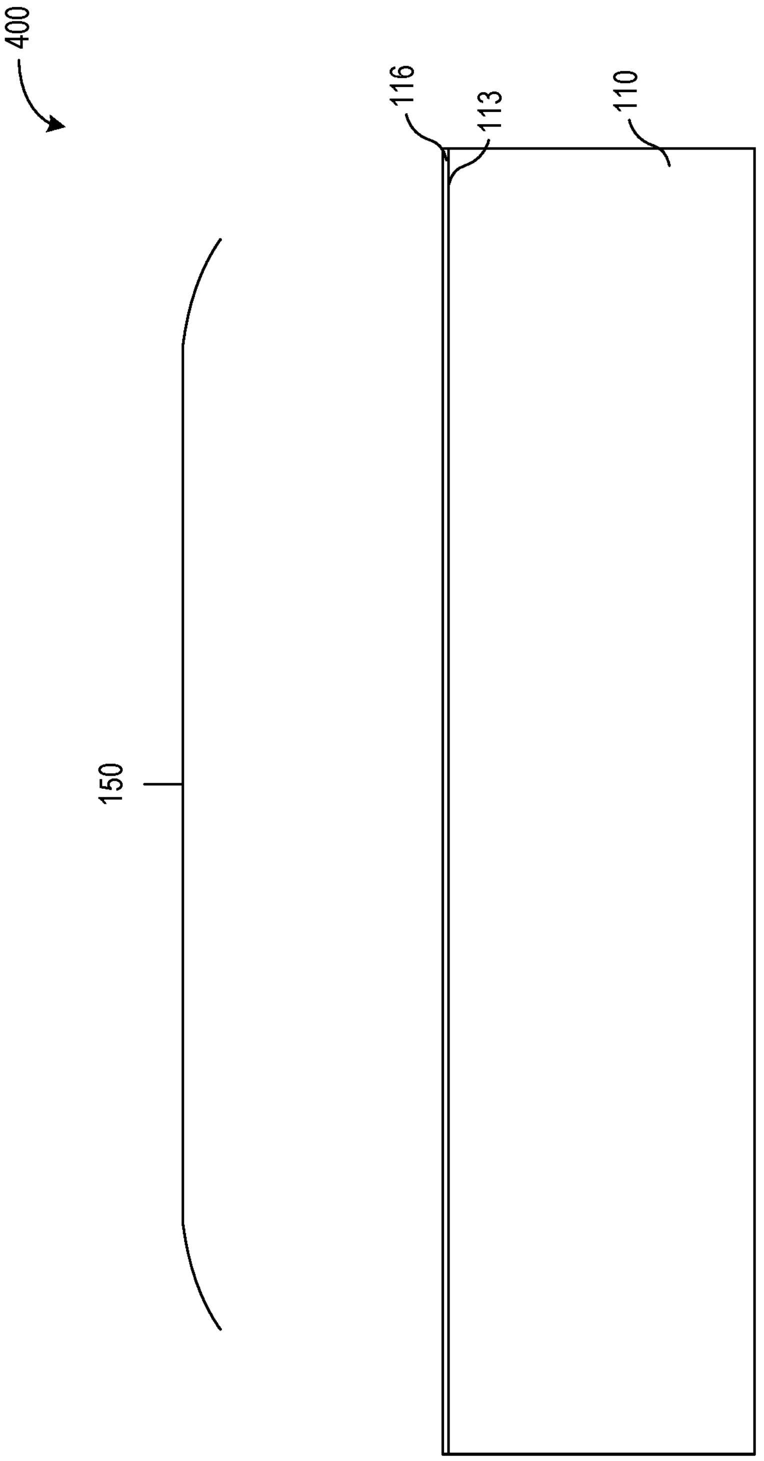

Referring next to step 204 of FIG. 2 and to FIG. 4, during a stage of fabrication 400, a first dielectric layer 116 is formed on (e.g., directly on and in contact with) the upper surface 113 of the semiconductor substrate 110. As mentioned above, in one or more embodiments, the first dielectric layer 116 may have a thickness in a range of about 30 Angstroms to about 1,500 Angstroms. The first dielectric layer 116 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via chemical vapor deposition (e.g., LPCVD) as a non-limiting example. In one or more embodiments, the first dielectric layer 116 may include an oxide (e.g., $SiO_2$, $ZrO_2$, $HfO_2$, $Al_2O_3$, or $TiO_2$ as non-limiting examples).

Figure 5:
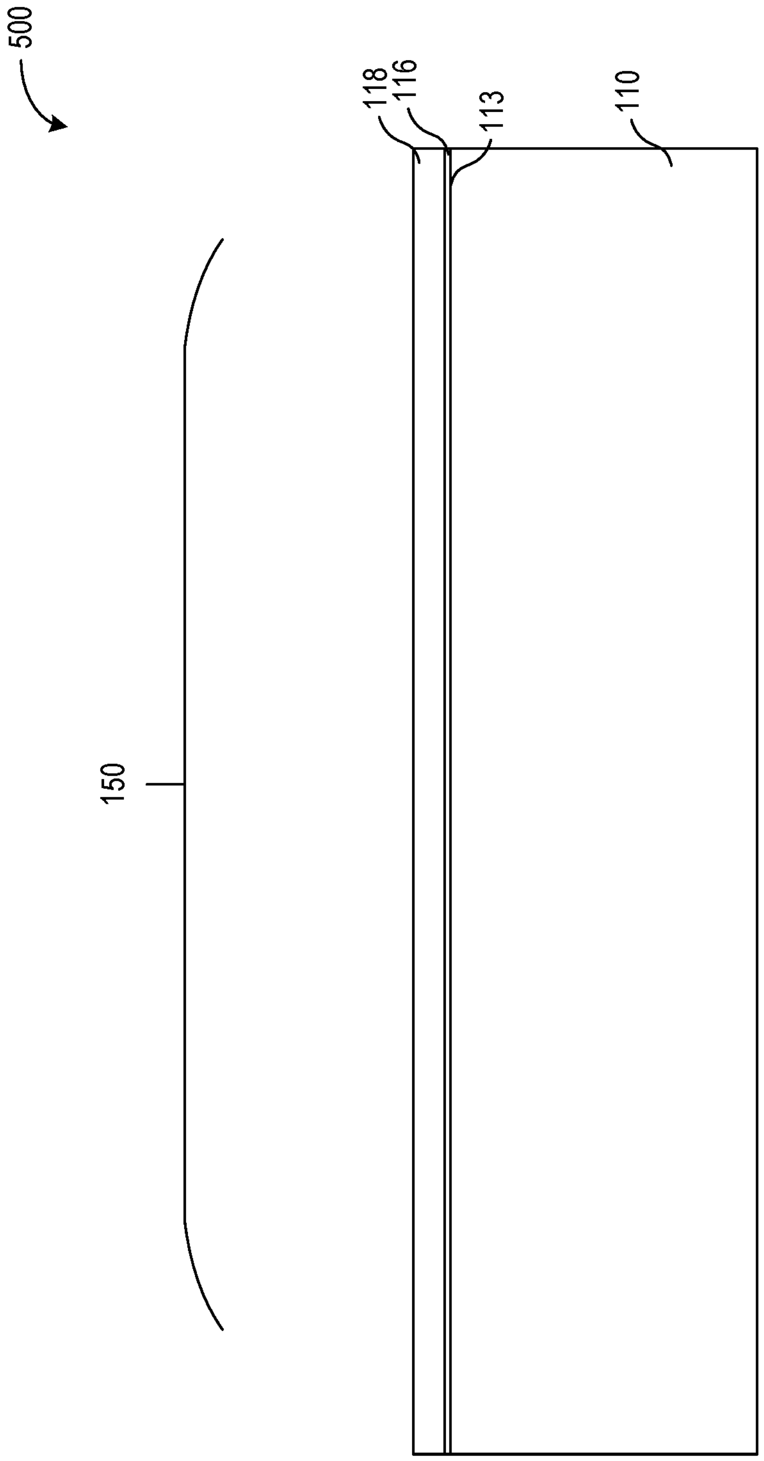

Referring next to step 206 of FIG. 2 and to FIG. 5, during a stage of fabrication 500, a second dielectric layer 118 is formed on (e.g., directly on and in contact with) the first dielectric layer 116. As mentioned above, in one or more embodiments, the second dielectric layer 118 may have a thickness in a range of about 100 Angstroms to about 4,000 Angstroms. The second dielectric layer 118 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via plasma enhanced chemical vapor deposition (e.g., PECVD) as a non-limiting example. In one or more embodiments, the second dielectric layer 118 may include a nitride (e.g., SiN, AlN, SiAlN as non-limiting examples).

Figure 6:
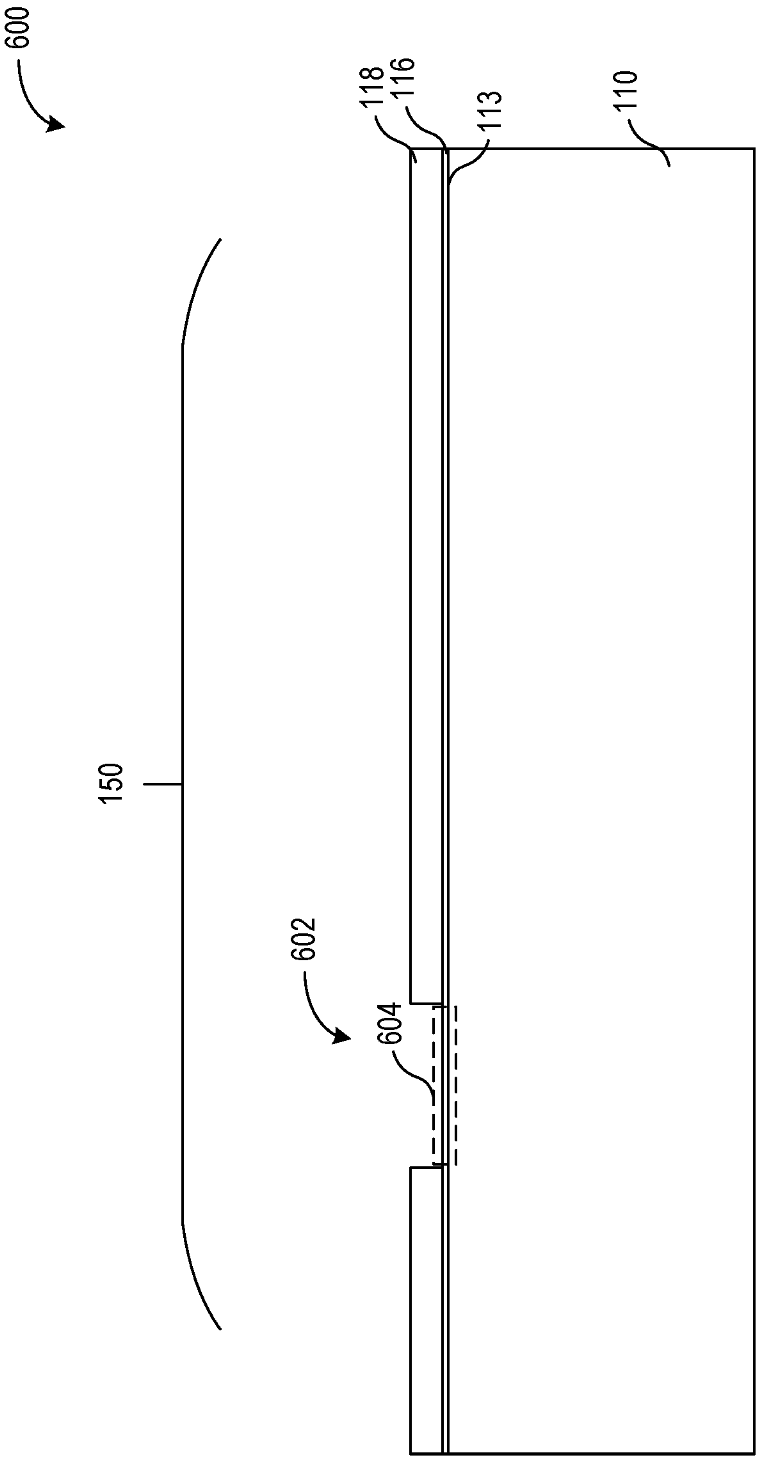

Referring next to step 208 of FIG. 2 and to FIG. 6, during a stage of fabrication 600, a patterned dry etch is performed to form an opening 602 in the second dielectric layer 118. Herein, a "patterned etch process" refers to a process in which etching of material is performed in conjunction with a photolithographic process, such that the material is etched through openings in a patterned photoresist layer.

For example, during the stage of fabrication 600, an anisotropic dry etch process (e.g., a RIE process or other plasma etching process, as non-limiting examples) is performed in combination with a photolithographic process to remove portions of the second dielectric layer 118, forming the opening 602 in the second dielectric layer 118, through which a surface of the first dielectric layer 116 is exposed. The first dielectric layer 116 may act as an etch stop for this dry etch process, thereby mitigating or preventing damage to the surface 113 of the substrate 110. This results in the exposed portion 604 of the first dielectric layer 116 being damaged (e.g., due to plasma damage) by the dry etch process.

Additionally, some of the exposed portion 604 of the first dielectric layer 116 is removed during the dry etch process, and the amount of material removed in this way can be process dependent and may not be uniform across concurrently fabricated transistor devices (e.g., when processing a wafer that includes multiple transistor devices). This can result in uncertainty as to the thickness of the exposed portion 604 and undesired non-uniformity of the exposed portion 604.

Figure 7:
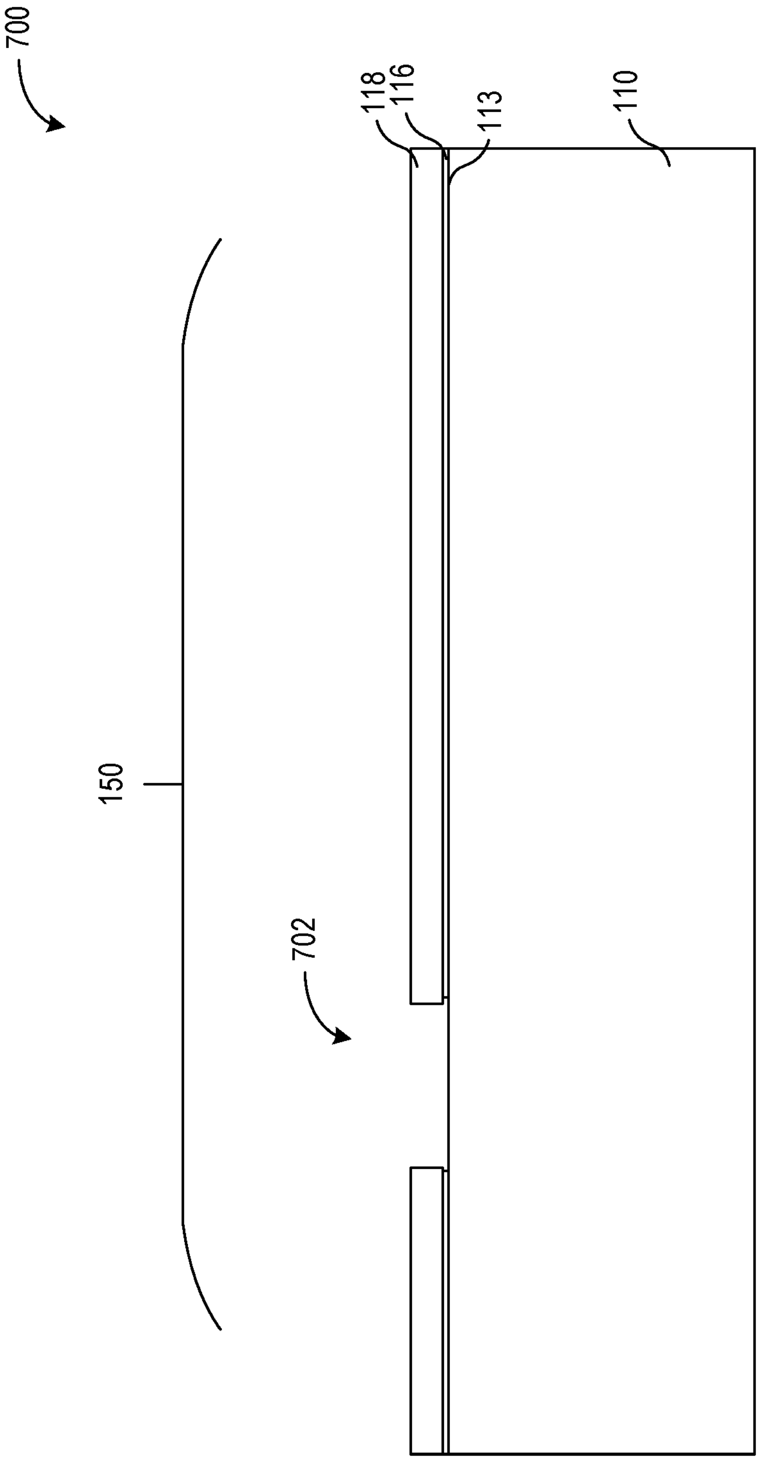

Referring next to step 210 of FIG. 2 and to FIG. 7, during a stage of fabrication 700, a wet etch is performed to remove the portion 604 of the first dielectric layer 116 that was damaged via exposure to the etch process at step 208, thereby forming an opening 702 that extends through the first dielectric layer 116 and the second dielectric layer 118. In one or more embodiments, the wet etch is a patterned wet etch. In one or more other embodiments, the wet etch is performed without using a photolithographic process, and instead forms the opening 702 by utilizing the existing pattern resulting from the dry etch process used at step 208.

In one or more embodiments, the portion 604 of the first dielectric layer 116 is removed via an anisotropic wet etch process that selectively etches the dielectric material (e.g., oxide material) of the first dielectric layer 116 with a higher etch rate than the dielectric material (e.g., nitride material) of the second dielectric layer 118. As shown, the wet etch may partially undercut the second dielectric layer 118 in the region of the opening 702. The opening 702 may correspond to the gate channel in which the gate structure is at least partially formed at a subsequent stage of fabrication (e.g., the stage of fabrication 1300 of FIG. 13). Herein, a "wet etch" typically refers to a wet chemical etch unless indicated otherwise.

Removing the portion 604 of the first dielectric layer 116 in this way avoids having the portion 604 act as a charge carrier trapping center in the transistor 101 due to the damage the portion 604 received from the dry etch at the step 208. Removing the portion 604 of the first dielectric layer 116 also avoids or reduces thickness non-uniformity in the first dielectric layer 116 attributable to the partial etching of the portion 604 during the dry etch at the step 208.

Figure 8:
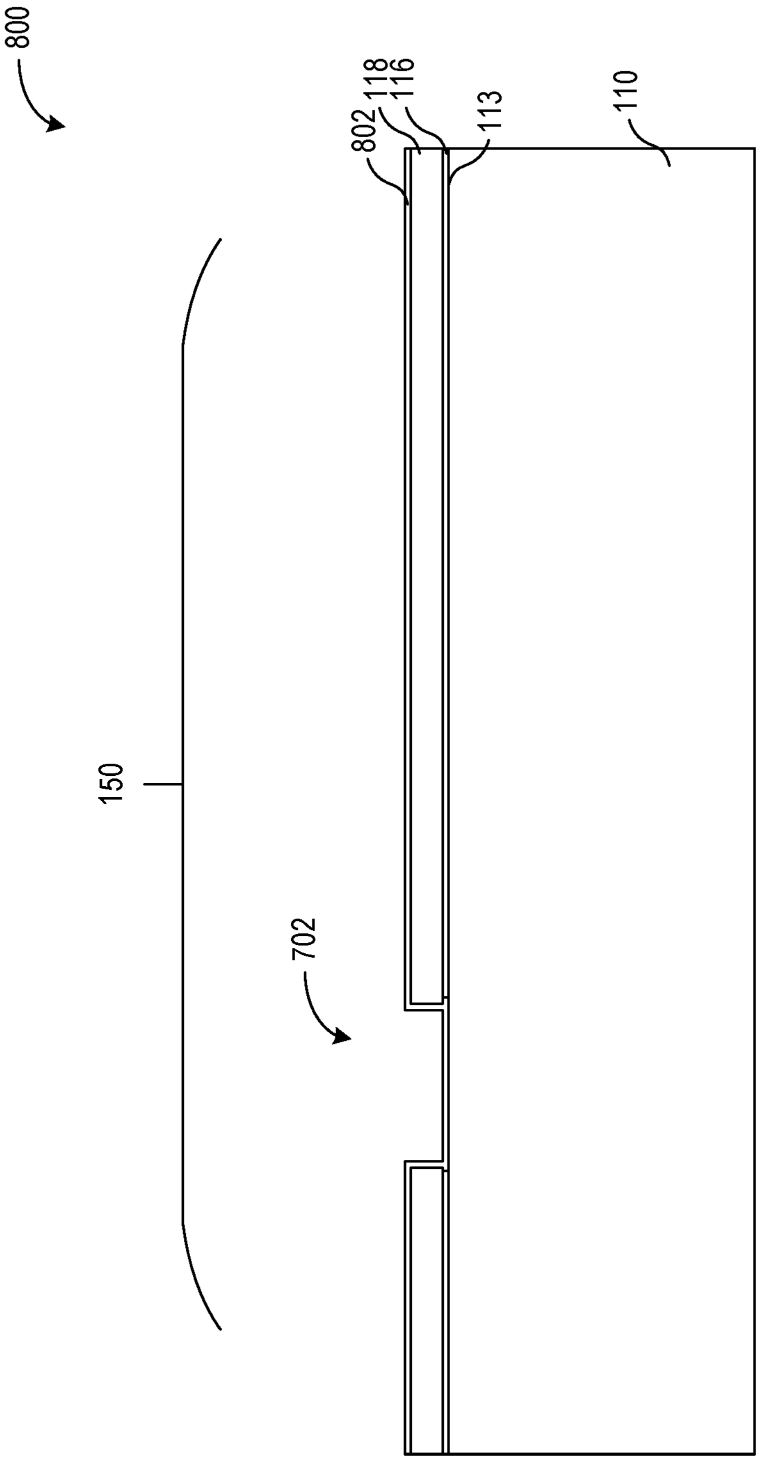

Referring next to step 212 of FIG. 2 and to FIG. 8, during a stage of fabrication 800, a first spacer layer 148 is formed over the substrate 110. The first spacer layer 148 may be formed directly on top and side surfaces of the second dielectric layer 118, side surfaces of the first dielectric layer 116, and the surface 113 of the substrate 110 exposed through the opening 702. In one or more embodiments, the first spacer layer 148 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via chemical vapor deposition (e.g., LPCVD) as a non-limiting example. In one or more embodiments, the first spacer layer 148 may include an oxide (e.g., $SiO_2$. $ZrO_2$, $HfO_2$, $Al_2O_3$, or $TiO_2$ as non-limiting examples).

Figure 9:
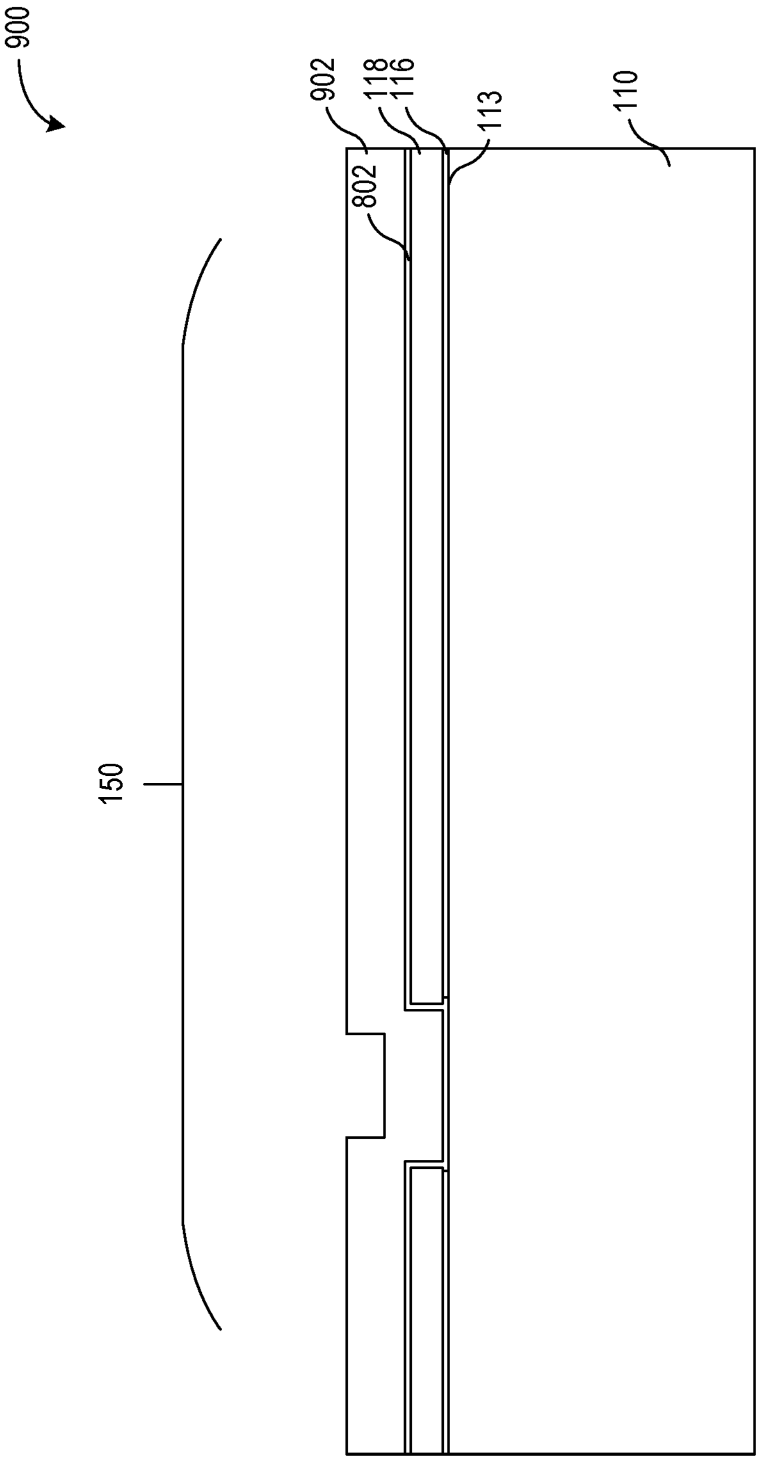

Referring next to step 214 of FIG. 2 and to FIG. 9, during a stage of fabrication 900, a second spacer layer 902 is formed over the substrate 110. The second spacer layer 902 may be formed directly on surfaces of the first spacer layer 148. In one or more embodiments, the second spacer layer 902 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via plasma enhanced chemical vapor deposition (e.g., PECVD) as a non-limiting example. In one or more embodiments, the second spacer layer 902 may include a nitride (e.g., SiN, AlN, SiAlN as non-limiting examples).

Figure 10:
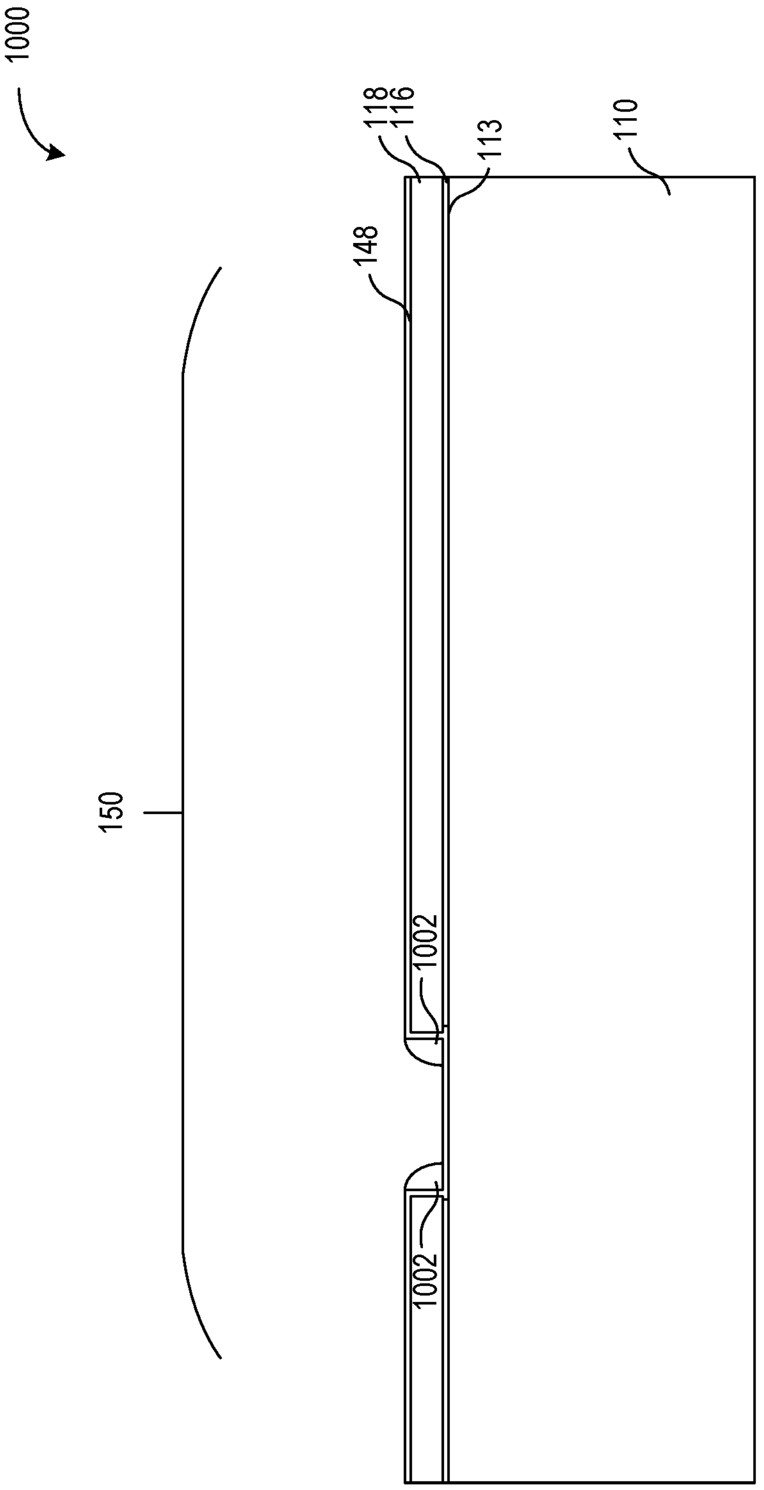

Referring next to step 216 of FIG. 2 and to FIG. 10, during a stage of fabrication 1000, a dry etch is performed to remove portions of the second spacer layer 902. The dry etch may be patterned or non-patterned (e.g., a blanket dry etch), in accordance with various embodiments. For example, during the stage of fabrication 1000, an anisotropic dry etch process (e.g., a RIE process or other plasma etching process, as non-limiting examples) may be performed to remove portions of the second spacer layer 902. Portions 1002 of the second spacer layer 902 remain in the gate channel upon completion of this dry etch process due to the second spacer layer 902 having greater thickness at edges of the gate channel. The first spacer layer 148 may act as an etch stop for this dry etch process, thereby mitigating or preventing damage to the surface 113 of the substrate 110. This results in the exposed portions of the first spacer layer 148 being damaged (e.g., due to plasma damage) by the dry etch process.

Figure 11:
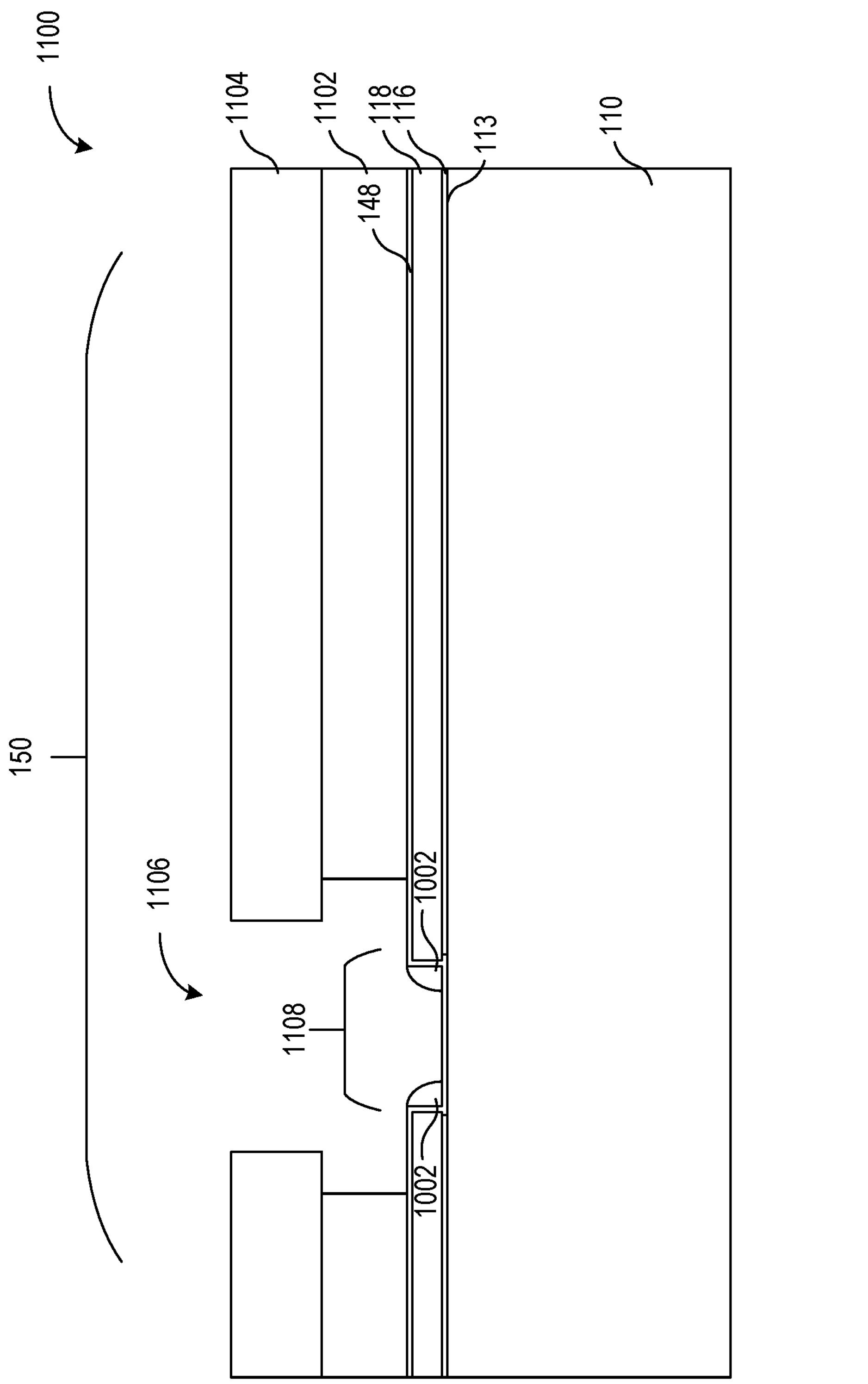

Referring next to step 218 of FIG. 2 and to FIG. 11, at a stage of fabrication 1100, a first patterned photoresist layer 1102 and a second patterned photoresist layer 1104 are formed over the substrate 110. For example, the first patterned photoresist layer 1102 and the second patterned photoresist layer 1104 may be formed via respective photolithographic processes, each including spin coating photoresist material (e.g., resin) over the substrate 110, exposing the photoresist material to ultraviolet (UV) light through a patterned mask, and baking at a predetermined temperature, and removing portions of the photoresist material (e.g., removing those portions exposed to UV light when using positive photoresist material or removing those portions not exposed to UV light when using negative photoresist material) using a developer solution. An opening 1106 is formed through the first and second photoresist layers 1102, 1104, through which a region (i.e., the "gate channel region") including the gate channel 1108 is exposed.

In one or more embodiments, the first photoresist layer 1102 may be developed concurrently with the second photoresist layer 1102. As shown, the opening in the first photoresist layer 1102 may be wider than the opening in the second photoresist layer 1104, such that the second photoresist layer 1104 overhangs the first photoresist layer 1102 in the region of the opening 1106.

In an example embodiment, the first photoresist layer 1102 has a thickness of around 0.5 μm to around 2 μm, although it should be understood that other suitable thicknesses may be used. In an example embodiment, the second photoresist layer 1104 has a thickness of between around 0.25 μm to around 1.5 μm although other suitable thicknesses may be used.

Figure 12:
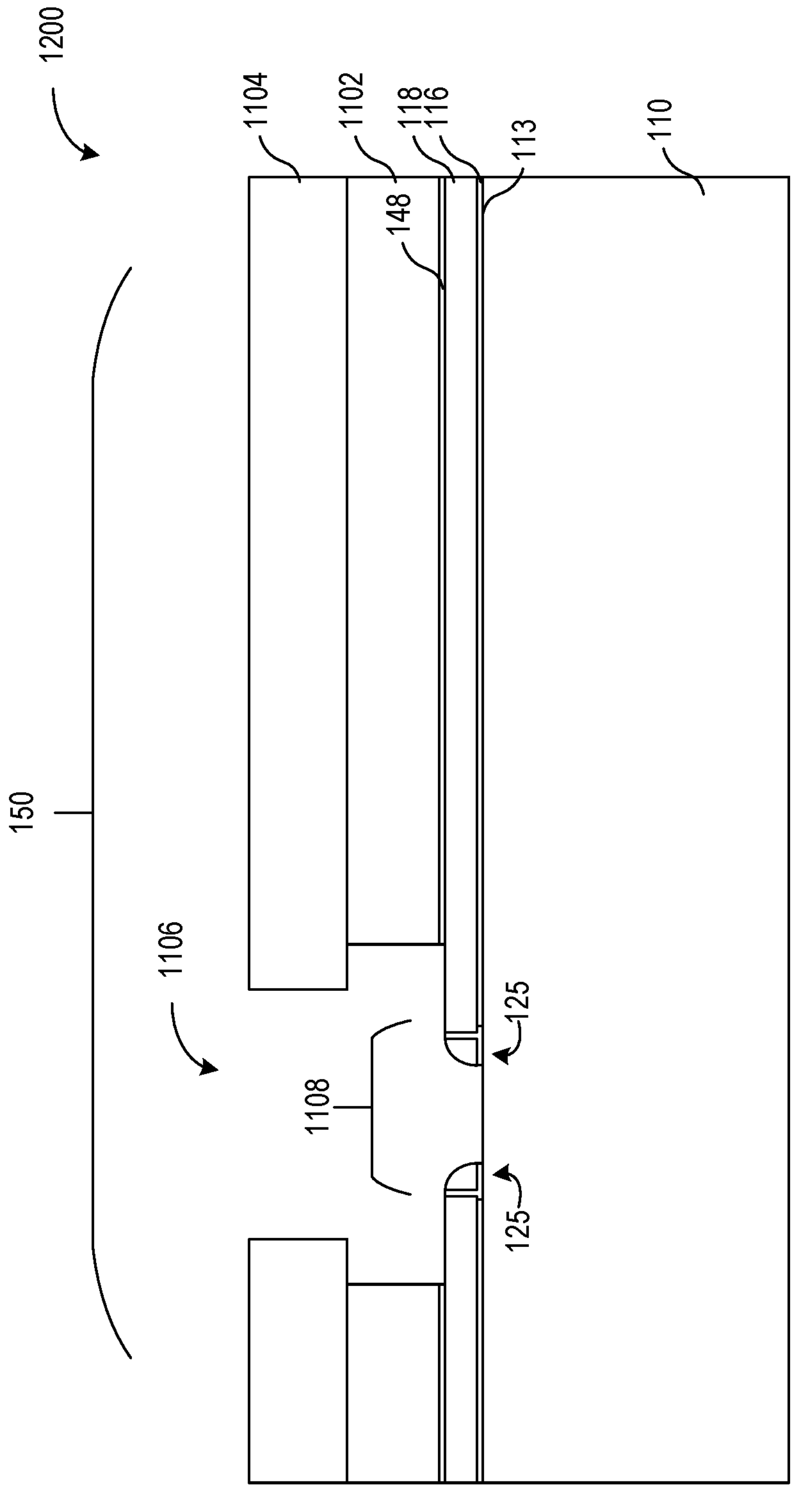

Referring next to step 220 of FIG. 2 and to FIG. 12, during a stage of fabrication 1200, a wet etch is performed to remove exposed portions of the first spacer layer 148 (i.e., exposed through the opening 1106). For example, exposed portions of the first spacer layer 148 that were damaged by the dry etch process at the step 216 are removed via this wet etch process. Some portions of the first spacer layer 148 remain upon completion of this wet etch process, which are disposed on top surfaces of the second dielectric layer 118 and in direct contact with side walls of the first dielectric layer 116, side walls of the second dielectric layer 118, and the surface 113 of the substrate 110 in the gate channel 1108. At least a some of these remaining portions of the first spacer layer 148 are disposed directly between the second dielectric layer 118 and the surface 113 of the substrate 110, due to filling in the undercut sections of the first dielectric layer 116 at or near the gate channel 1108. Together with the portions 1002, the remaining portions of the first spacer layer 148 in the gate channel 1108 form spacer structures 125 in the gate channel 1108.

The width of each spacer structure 125 corresponds to the respective thicknesses of the first spacer layer 148 and the second spacer layer 902 (e.g., with greater initial thicknesses, at deposition, of the layers 148 and 902 corresponding to wider spacer structures 125). Thus, the widths of the spacer structures 125 may be set based on the amount of dielectric material deposited when forming each of the first spacer layer 148 and the second spacer layer 902.

In this way, the gate length of the transistor device 100 may be adjusted by adjusting the thickness of dielectric material deposited when forming the first spacer layer 148 and the second spacer layer 902. For example, forming thicker spacer layer 148, 902 results in wider spacer structures 125, which reduces the gate length of the subsequently formed gate structure 128. In some instances, by forming sufficiently wide spacer structures 125, a gate length of the bottom of gate electrode 128 may be achieved that is not otherwise achievable using only conventional photolithographic techniques.

Figure 13:
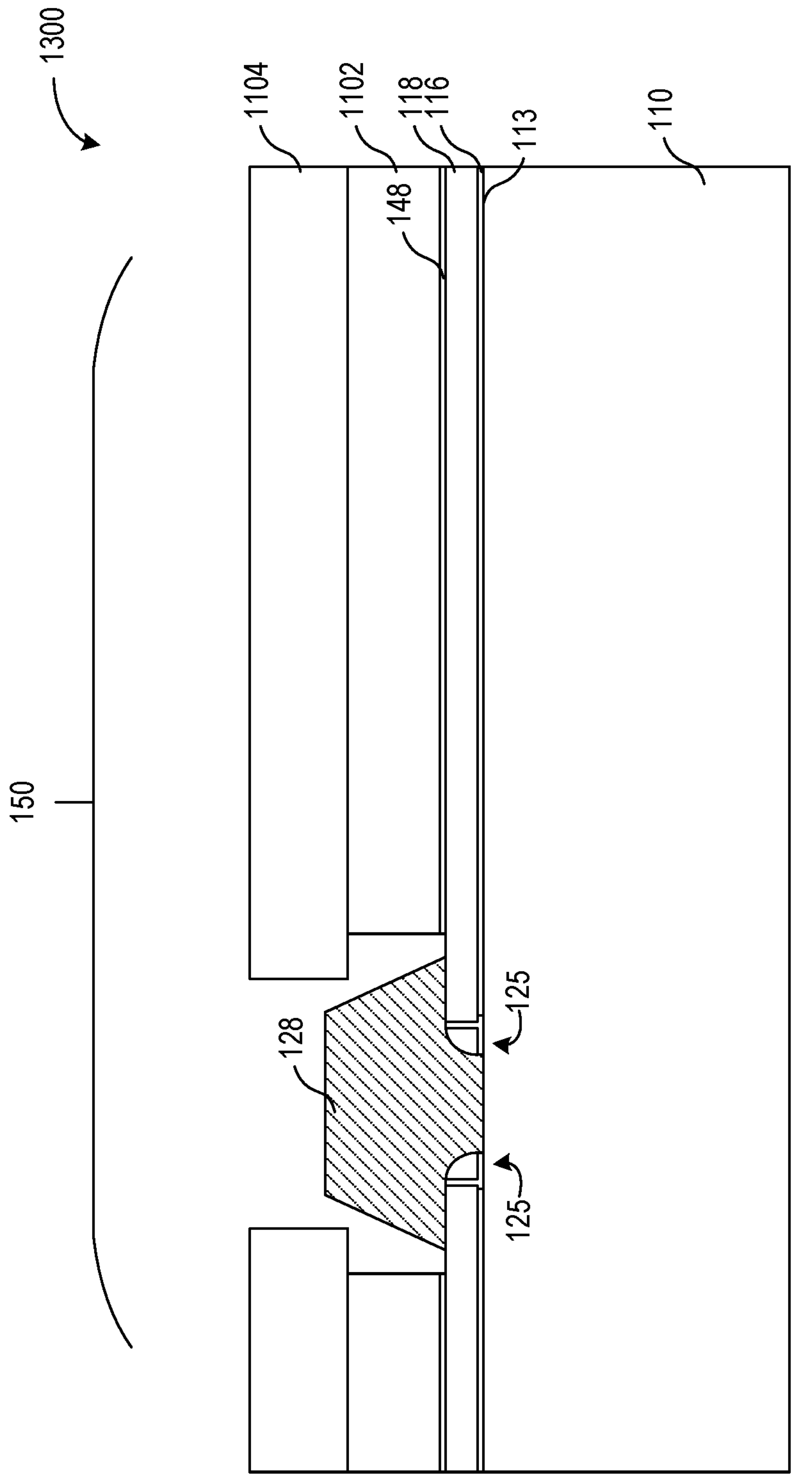

Referring next to step 222 of FIG. 2 and to FIG. 13, at a stage of fabrication 1300, a gate structure 128 is formed through the openings 1106 in the first photoresist layer 1102 and the second photoresist layer 1104. The gate structure 128 may be electromagnetically coupled to the channel 108 through the upper surface 113 of the substrate 110 and the barrier layer 112. During operation of the transistor device 100, changes to the electric potential of gate structure 128 may shift the quasi-Fermi level for the barrier layer 112 compared to the quasi-Fermi level for the channel layer 106 and thereby modulate the electron concentration in the channel 108 within the portion of the substrate 110 under the gate structure 128.

In one or more embodiments, the gate structure 128 may be configured as a Schottky gate and may be formed over and directly in contact with the upper substrate surface 113 using a Schottky material layer and a conductive metal layer. In one or more embodiments, Schottky or other suitable materials may be combined with highly conductive materials in a metal stack to form the gate structure 128. For example, a Schottky material layer may first be formed in contact with the substrate 110, and a conductive low-stress metal may be deposited over the Schottky material layer to form the gate structure 128. In one or more other embodiments, the gate structure 128 may be formed over a gate dielectric or gate oxide (not illustrated) on the upper surface 113 of the substrate 110, thus forming a metal-insulator-semiconductor (MIS) junction or metal oxide semiconductor (MOS) junction, which may be electrically coupled to the channel 108 through the gate dielectric or gate oxide layer.

The gate structure 128 may have a T-shaped cross section, as shown in the present example, with a vertical stem over the substrate 110 that passes through at least the first dielectric layer 116 and the second dielectric layer 118 in the gate channel 1108, and a wider portion over the vertical stem that has horizontal portions that overlie and contact upper surfaces of the second dielectric layer 118 and portions of the spacer structures 125, in accordance with one or more embodiments. In one or more other embodiments (not shown), the gate structure 128 may have a square or rounded cross-sectional shape. In one or more other embodiments, the vertical stem or lower portion of the gate structure 128 may be recessed through the upper surface 113 of the semiconductor substrate 110 and may extend partially into the barrier layer 112, increasing the electrical coupling of gate structure 128 to channel 108 through the barrier layer 112.

The gate metal of the gate structure 128 may be deposited by evaporation, sputtering, chemical vapor deposition, or another suitable process. For example, a first portion of the deposited gate metal may be disposed in the openings 1106 to form at least a portion of the gate structure 128 and a second portion of the deposited gate metal may be disposed on the upper surface(s) of the second photoresist layer 1104.

Figure 14:
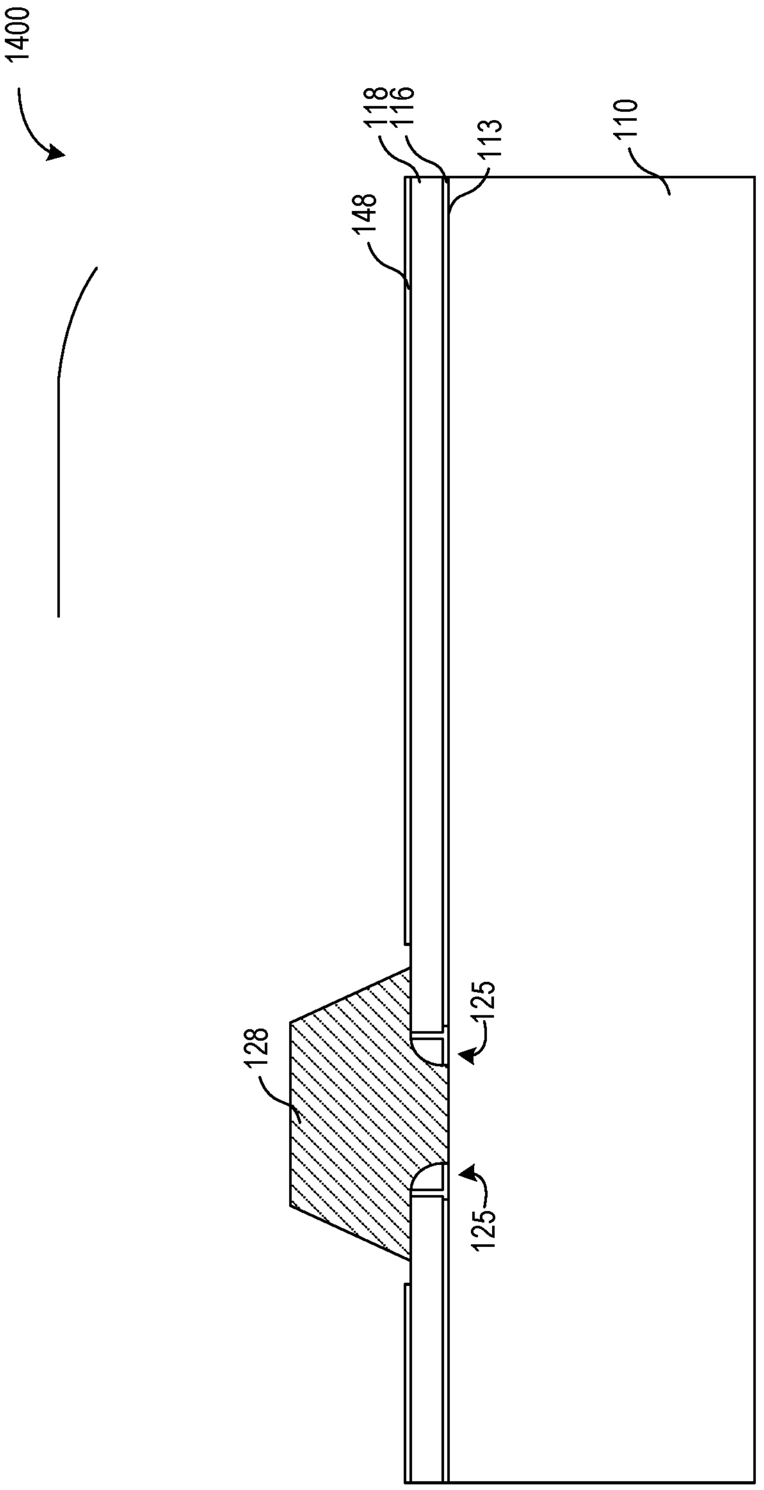

Referring next to step 224 of FIG. 2 and to FIG. 14, at a stage of fabrication 1400, the first photoresist layer 1102, the second photoresist layer 1104, and the second portion of gate metal deposited on the surface(s) of the second photoresist layer 1104 are concurrently removed via a lift-off process. For example, in the lift-off process, a photoresist striper (e.g., a solvent such as acetone, 1-methyl-2-pyrrolidone, or dimethyl sulfoxide) may be applied to remove the first photoresist layer 1102 and the second photoresist layer 1104, which detaches (i.e., "lifts-off") the excess gate metal on the surface of the second photoresist layer 1104.

While a bi-layer lift-off process has been described in connection with steps 220, 222, 224 of FIG. 2 and stages of fabrication 1100, 1200, 1300, 1400 of FIGS. 11-14, it should be understood that this is intended to be illustrative and not limiting. For example, other photolithographic processes (e.g., using a single photoresist layer that is developed with an undercut profile) may instead be used when forming the gate structure 128 in one or more other embodiments.

Figure 15:
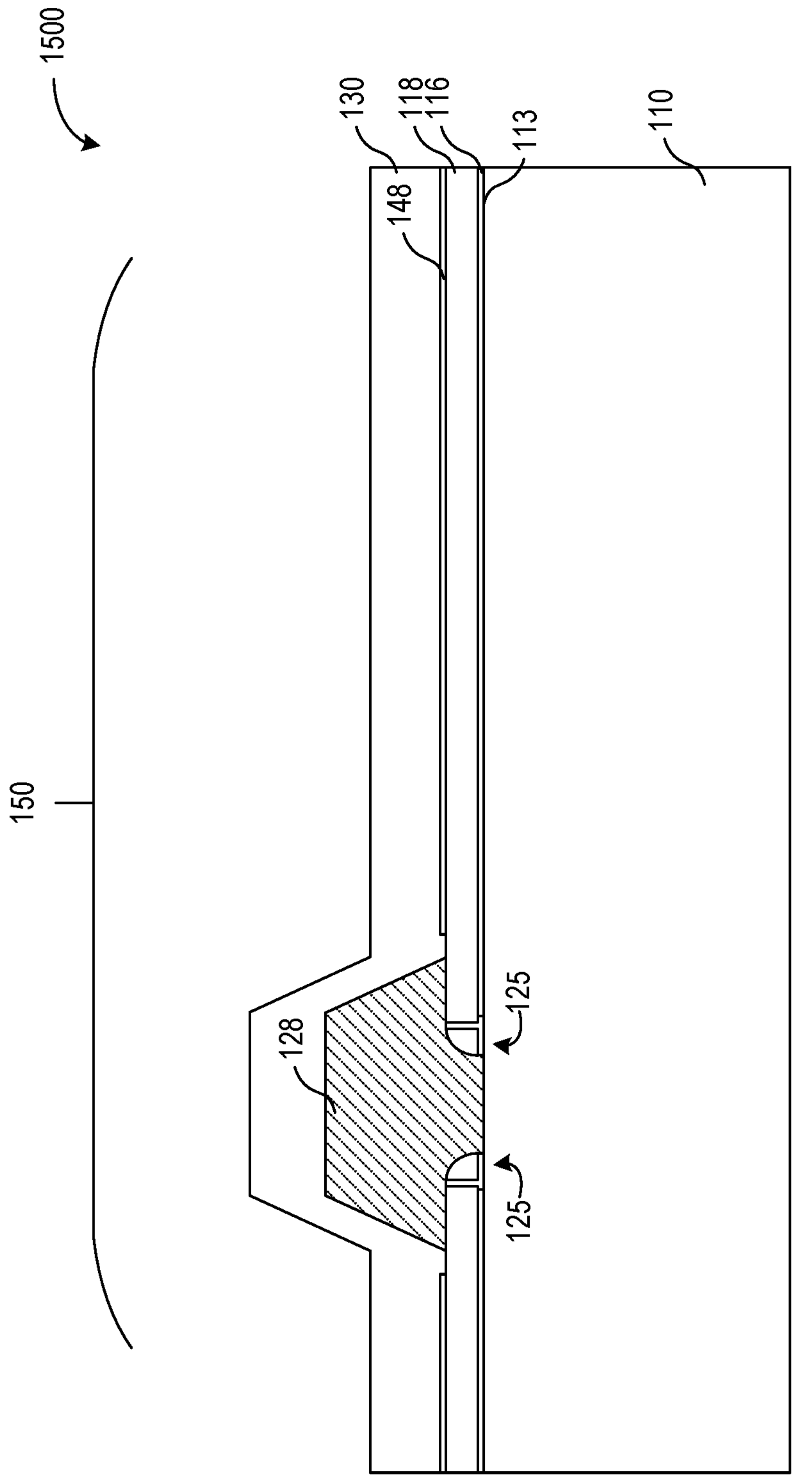

Referring next to step 226 of FIG. 2 and to FIG. 15, at a stage of fabrication 1500, an ILD layer 130 is formed over the substrate 110 (e.g., in contact with surfaces of each of the second dielectric layer 118, first spacer layer 148 and the gate structure 128). In one or more embodiments, the ILD layer 130 has a thickness in a range of about 500 Angstroms to about 10,000 Angstroms, although other suitable thicknesses may be used. The ILD layer 130 may be formed from silicon nitride, silicon oxide, silicon oxynitride or other suitable dielectric materials, as non-limiting examples.

Figure 16:
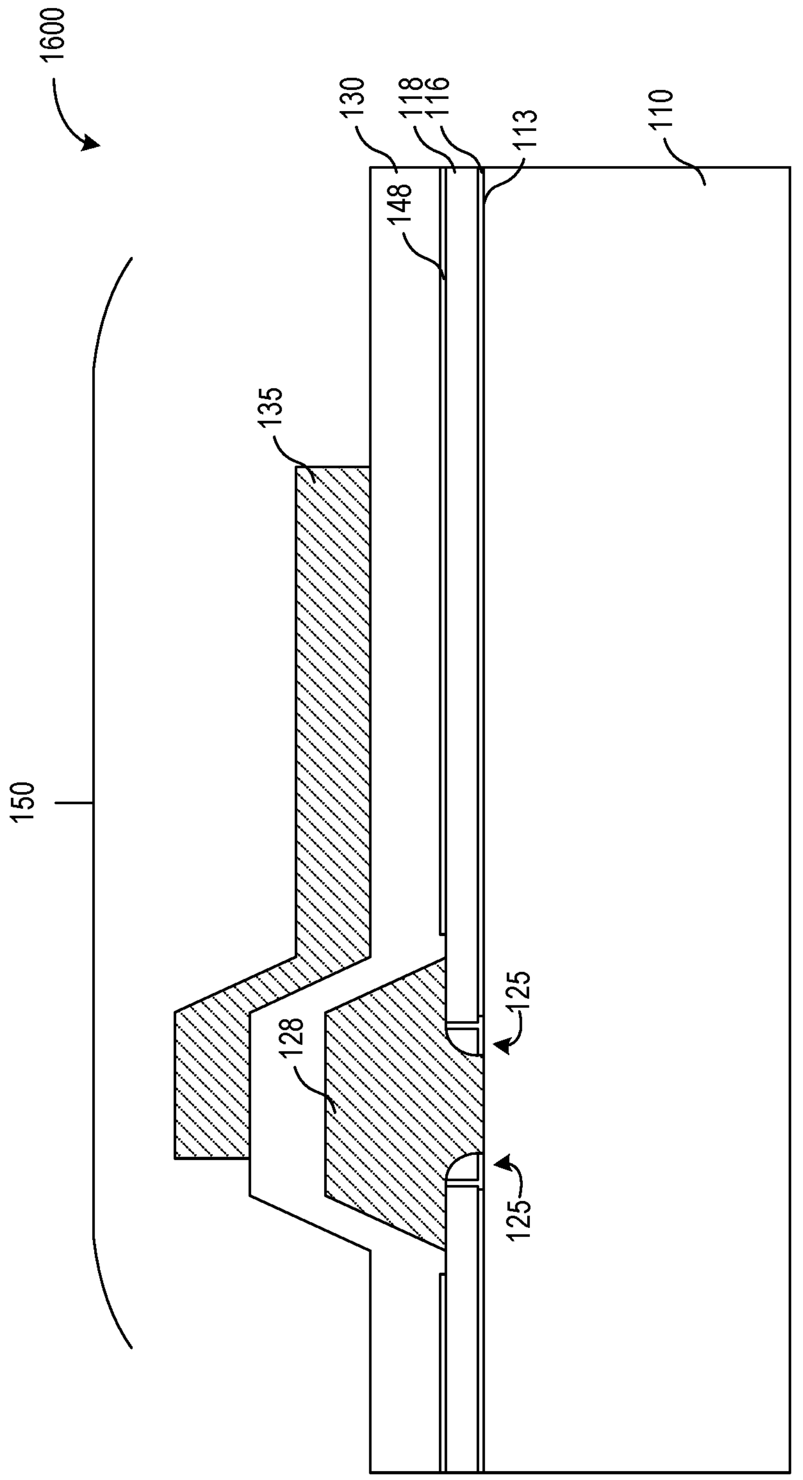

Referring next to step 228 of FIG. 2 and to FIG. 16, at a stage of fabrication 1600, a field plate 135 is formed on the ILD layer 130. For example, a patterned conductive layer may be formed (e.g., deposited via sputtering, evaporation, or chemical vapor deposition as non-limiting examples, then patterned using a suitable photolithographic process) over the substrate 110 to form the field plate 135. For example, the conductive layer may include electrically conductive material, such as TiW, TiWN, WSi, or other suitable materials. The conductive layer may have a thickness in a range of about 100 Angstroms to about 5,000 Angstroms, although other suitable thicknesses may be used.

It should be understood that additional processing steps may be performed to fabricate the transistor device 100, which may be performed before (e.g., ohmic implantation processes) or after performance of the method 200 of FIG. 2. Such processing steps may include the deposition and patterning of additional dielectric layers (e.g., dielectric layer 138 or other applicable dielectric layers) and metal layers (e.g., the interconnect layers 140, 141, or other applicable metal layers) as non-limiting examples.

Figure 17:
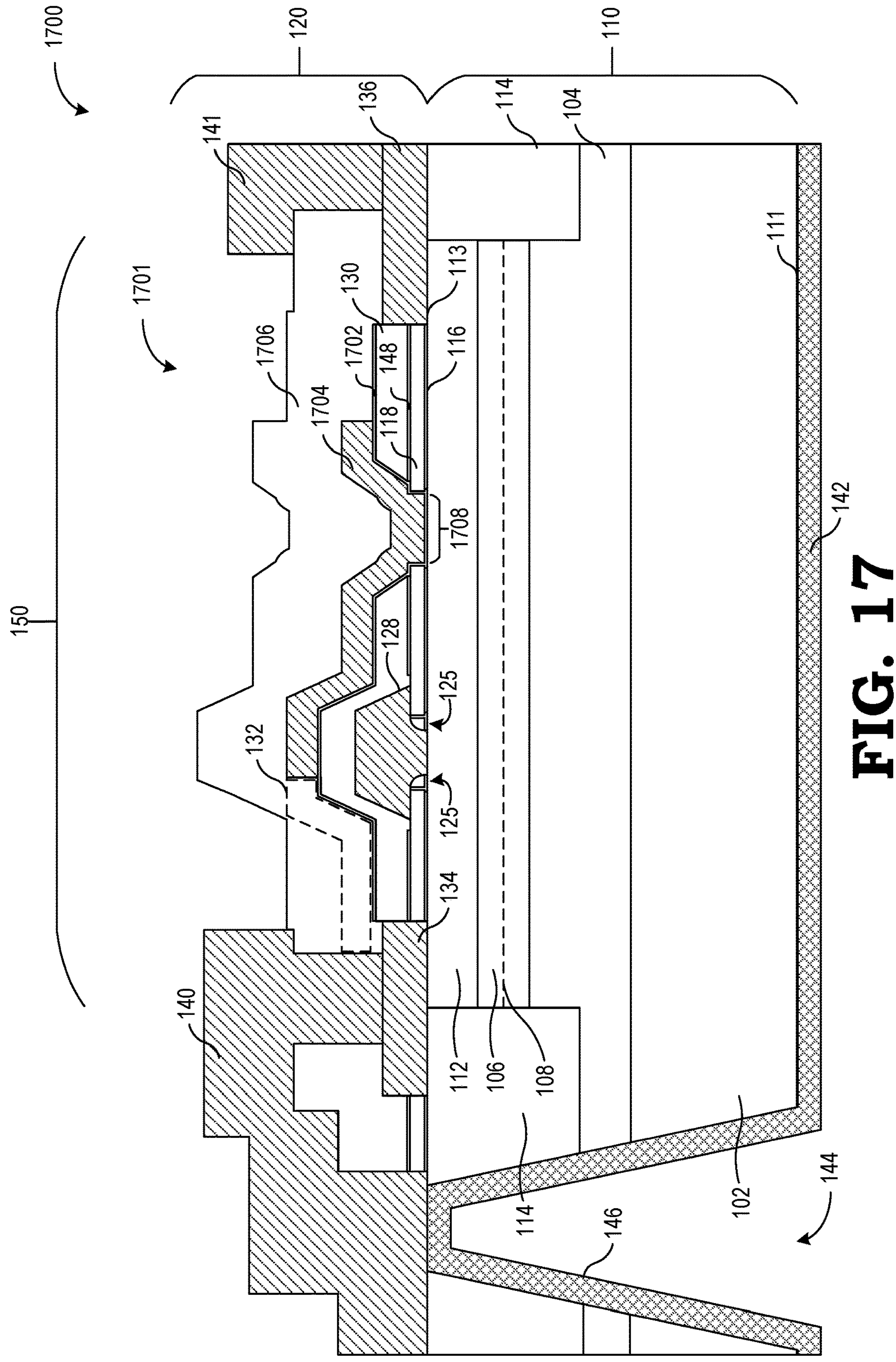
FIG. 17 is a cross-sectional side view of a transistor device, in accordance with various embodiments.

In one or more embodiments, it may be desirable to dispose a portion of the field plate of a transistor device in closer proximity to the surface of the substrate (e.g., compared to if the field plate were to only directly overlap the gate structure), which may be achieved through formation of a field plate channel extending through dielectric layers over the substrate, offset from the gate channel. For example, FIG. 17 shows a cross-sectional side-view of a transistor device 1700 that includes a transistor 1701. The transistor 1701 includes a field plate channel 1708 and a third dielectric layer 1702. The third dielectric layer 1702 is disposed on surfaces of the ILD layer 130 and, in the field plate channel 1708, on side walls of the first and second dielectric layers 116, 118, and the surface 113 of the substrate 110. It should be noted that various features of the transistor device 1700 correspond to those described above in connection with the transistor device 100 of FIG. 1, with like reference numerals being used here to denote similar elements, where descriptions of such elements are not necessarily repeated here for sake of brevity.

The third dielectric layer 1702 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via chemical vapor deposition (e.g., LPCVD) as a non-limiting example. A field plate 1704 is disposed directly on the third dielectric layer 1702. The field plate 1704 may be similar to the field plate 135 of FIG. 1, at least with respect to material and thickness. The field plate 1704 may at least partially overlap the gate structure 128 and the gate channel and may be at least partially disposed in the field plate channel 1708, such that a portion of the third dielectric layer 1702 in the field plate channel 1708 is directly interposed between the surface 113 of the substrate 110 and the field plate 1704.

Portions of a first spacer layer 148 may be disposed as part of the spacer structures 125 on upper surfaces of the second dielectric layer 118. The first spacer layer 148 may be similar to the first spacer layer 148 of FIGS. 8-10, at least with respect to material and thickness.

A dielectric layer 1706 may be disposed directly on the field plate 1704 and portions of the third dielectric layer 1702. The dielectric layer 1706 may be similar to the dielectric layer 138 of FIG. 1, at least with respect to material and thickness.

The third dielectric layer 1702 may be formed after formation of the field plate channel 1708 and prior to formation of the field plate 1704. Separating the field plate 1704 from the surface 113 of the substrate 110 using a dielectric layer that is formed after formation of the field plate channel 1708 (i.e., the third dielectric layer 1702) ensures that this dielectric material has not been damaged by the etch (e.g., dry etch) used to form an opening in the ILD layer 130 that overlaps the field plate channel 1708. Removal and replacement of damaged dielectric material in the field plate channel 1708 reduces the likelihood of charge carrier traps being present in the field plate channel 1708, which advantageously improves performance of the transistor device 1700. This approach also provides better thickness uniformity of the dielectric material that separates the field plate 1704 from the surface 113 in the field plate channel 1708, which advantageously reduces process variation with respect to the amount of separation between the field plate 1704 and the surface 113 in the field plate channel 1708.

The arrangement shown the present example is intended to be illustrative and not limiting. For example, in one or more other embodiments, the third dielectric layer 1702 may be omitted, and the first spacer layer 148 may instead cover the surface 113 of the substrate 110 in the field plate channel 1708.

Figure 18:
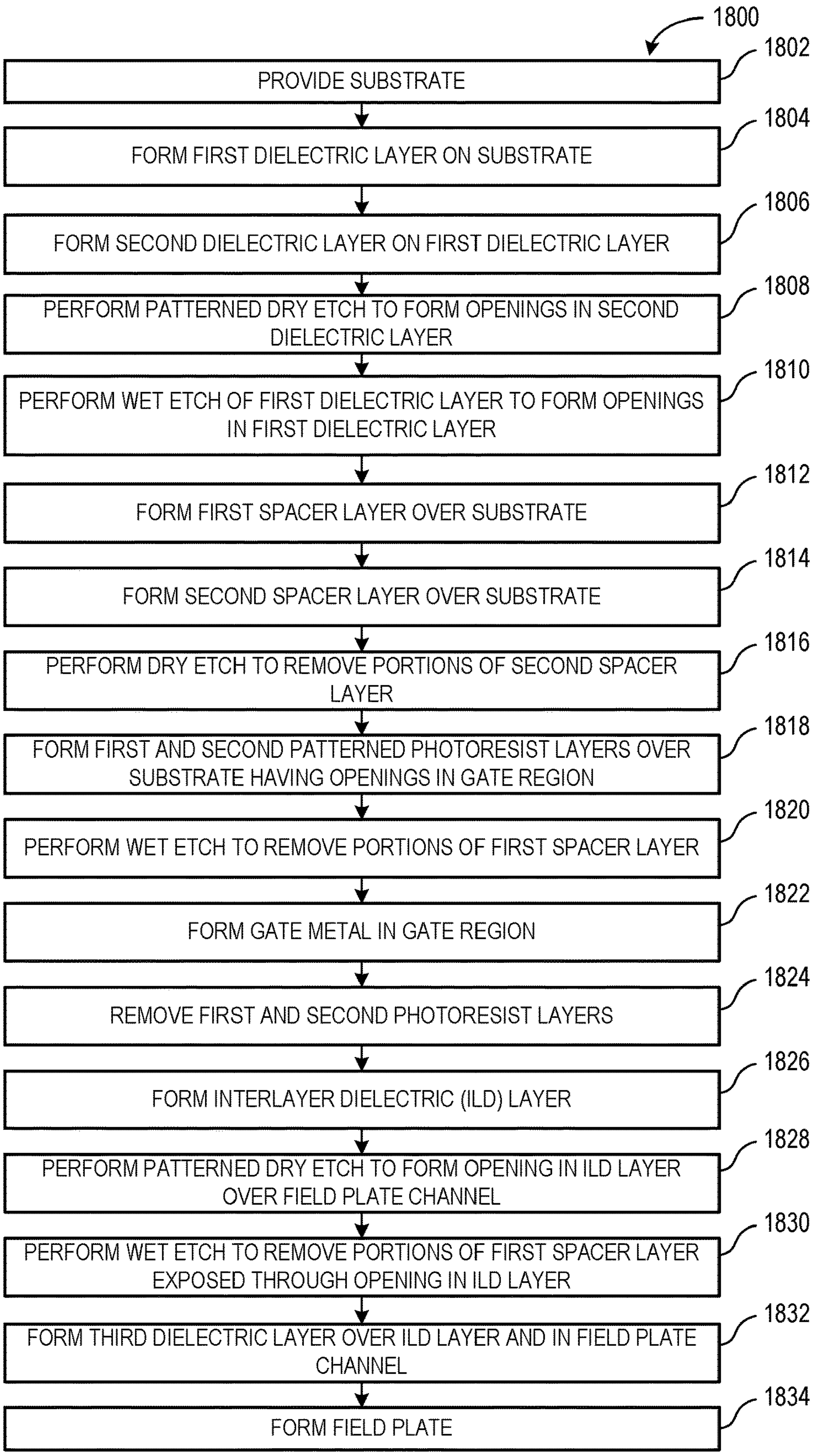
FIG. 18 is a process flow diagram describing a method for fabricating the transistor device of FIG. 17, in accordance with various embodiments.

FIG. 18 is a process flow diagram depicting a method for fabricating at least a portion of a transistor device, such as the transistor device 1700 of FIG. 17, in accordance with various embodiments. For enhanced understanding. FIG. 18 may be viewed simultaneously with FIGS. 19-35, which are cross sectional views depicting the transistor device 1700 of FIG. 17 at various stages of fabrication in accordance with various embodiments.

Figure 19:
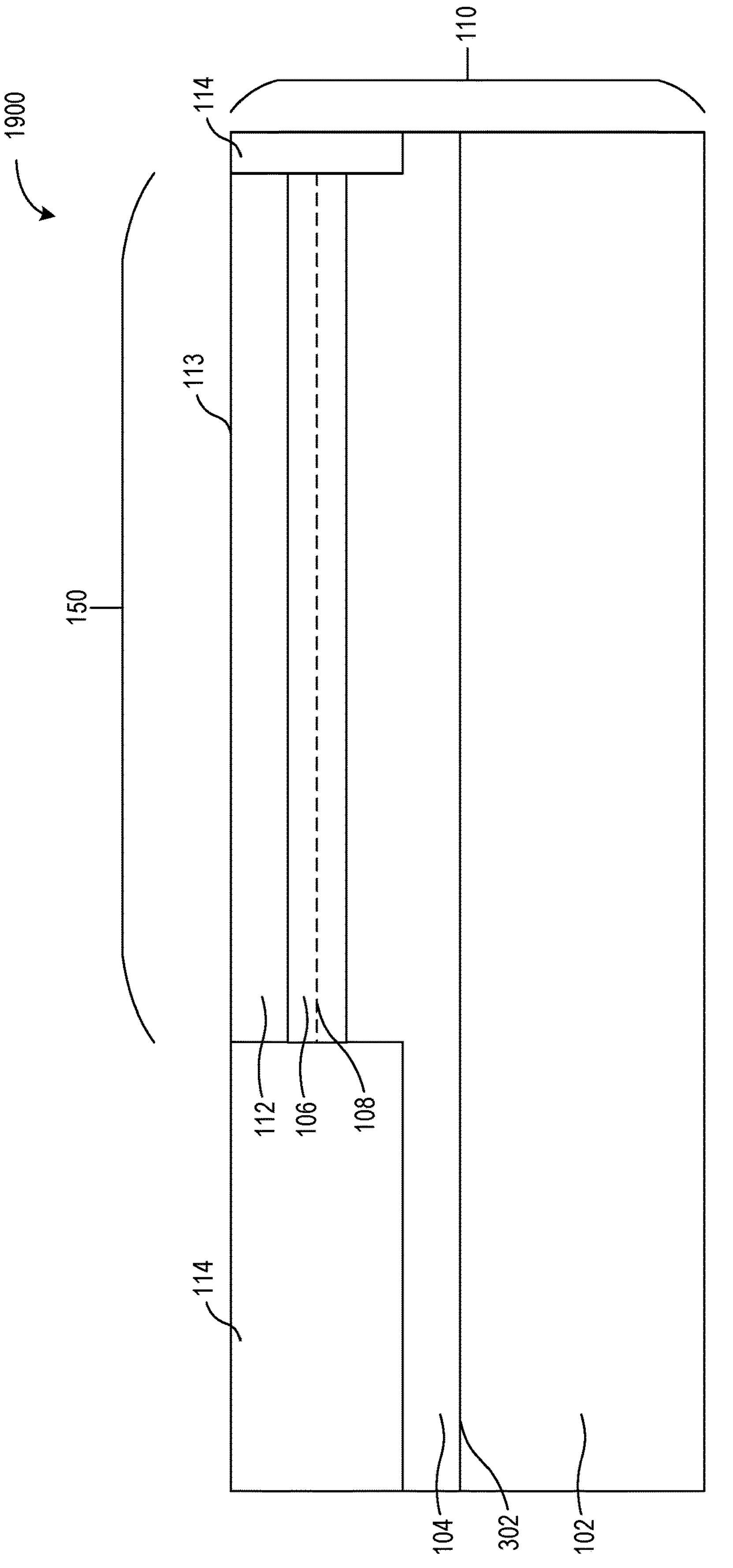
FIGS. 19-35 are cross-sectional views depicting the transistor device of FIG. 17 at various stages of fabrication, in accordance with various embodiments.

Referring first to step 1802 of FIG. 18 and to FIG. 19, at a first stage of fabrication 1900, a semiconductor substrate 110 is provided, and an active region 150 is defined in the semiconductor substrate 110. It should be noted that various features of the step 1802 and the first stage of fabrication 1900 correspond to those described above in connection the step 202 of FIG. 2 and the stage of fabrication 300 of FIG. 3, with like reference numerals being used here to denote similar elements. Descriptions of such similar elements are not repeated here for sake of brevity.

Figure 20:
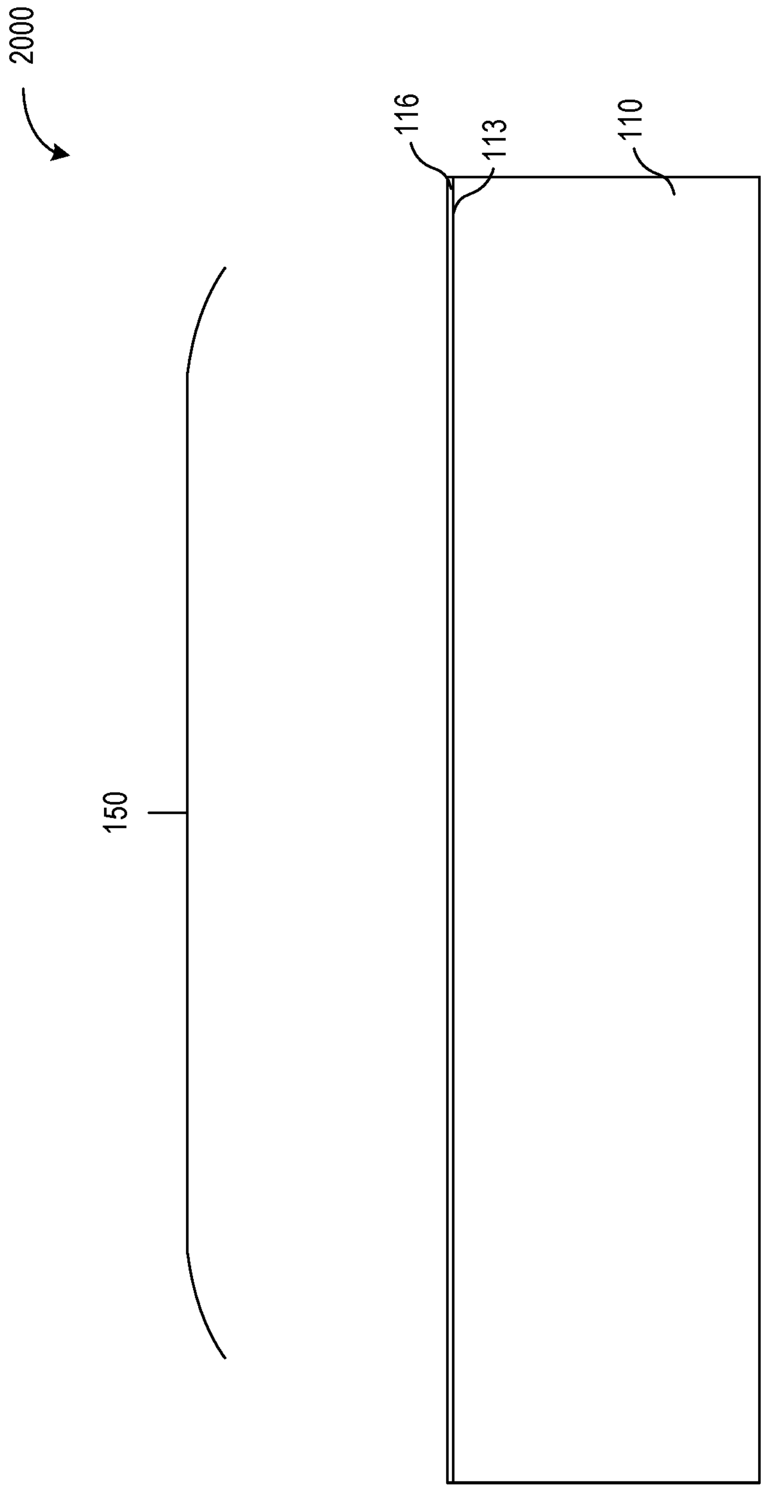

Referring next to step 1804 of FIG. 18 and to FIG. 20, during a stage of fabrication 2000, a first dielectric layer 116 is formed on (e.g., directly on and in contact with) the upper surface 113 of the semiconductor substrate 110. As mentioned above, in one or more embodiments, the first dielectric layer 116 may have a thickness in a range of about 30 Angstroms to about 1,500 Angstroms. The first dielectric layer 116 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via chemical vapor deposition (e.g., LPCVD) as a non-limiting example. In one or more embodiments, the first dielectric layer 116 may include an oxide (e.g., $SiO_2$, $ZrO_2$, $HfO_2$, $Al_2O_3$, or $TiO_2$ as non-limiting examples).

Figure 21:
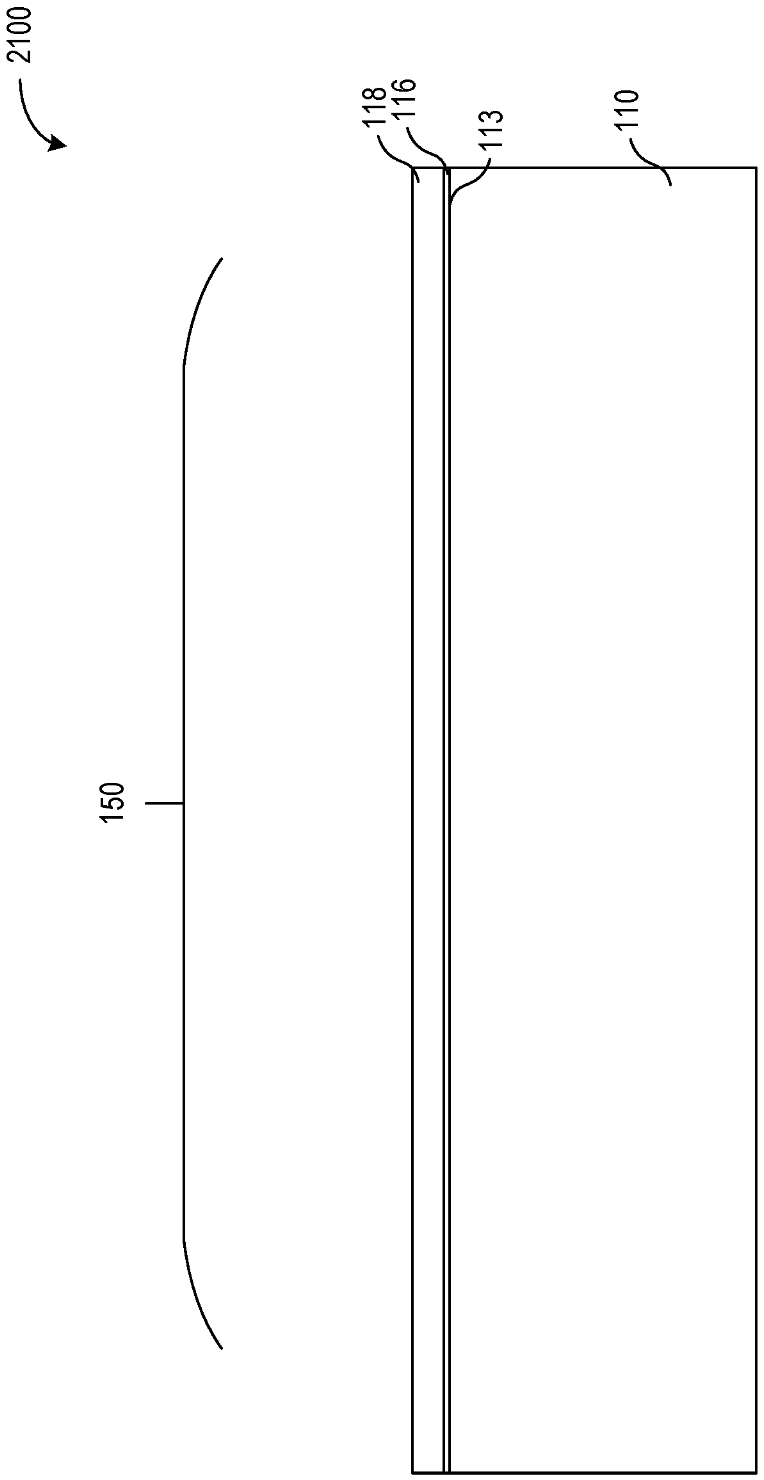

Referring next to step 1806 of FIG. 18 and to FIG. 21, during a stage of fabrication 2100, a second dielectric layer 118 is formed on (e.g., directly on and in contact with) the first dielectric layer 116. As mentioned above, in one or more embodiments, the second dielectric layer 118 may have a thickness in a range of about 100 Angstroms to about 4,000 Angstroms. The second dielectric layer 118 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via plasma enhanced chemical vapor deposition (e.g., PECVD) as a non-limiting example. In one or more embodiments, the second dielectric layer 118 may include a nitride (e.g., SiN, AlN, SiAlN as non-limiting examples).

Figure 22:
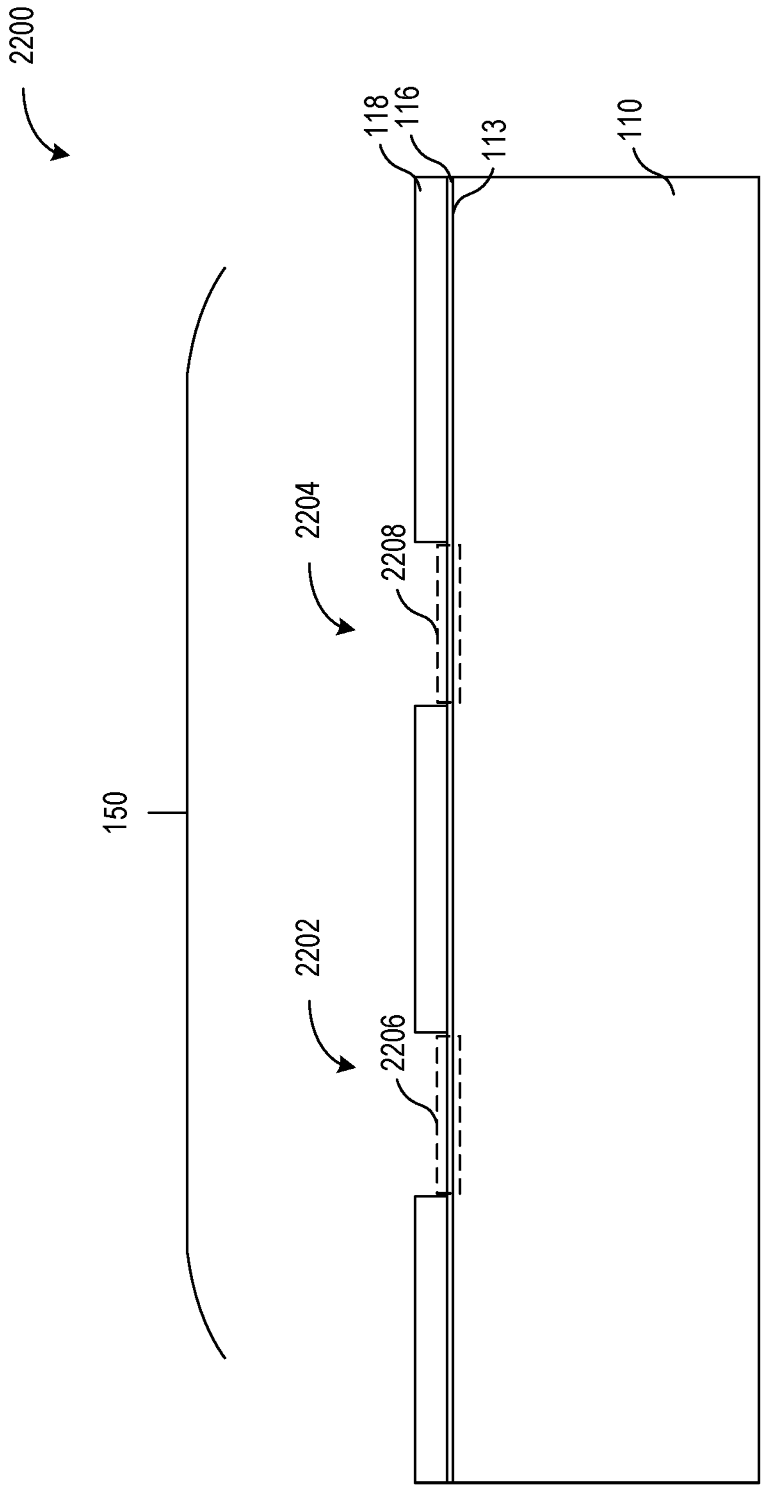

Referring next to step 1808 of FIG. 18 and to FIG. 22, during a stage of fabrication 2200, a patterned dry etch is performed to form an opening 2202 and an opening 2204 in the second dielectric layer 118. For example, during the stage of fabrication 2200, an anisotropic dry etch process (e.g., a RIE process or other plasma etching process, as non-limiting examples) is performed in combination with a photolithographic process to remove portions of the second dielectric layer 118, forming the openings 2202, 2204 in the second dielectric layer 118, through which surfaces of the first dielectric layer 116 are exposed. The first dielectric layer 116 may act as an etch stop for this dry etch process, thereby mitigating or preventing damage to the surface 113 of the substrate 110. This results in exposed portions 2206, 2208 of the first dielectric layer 116 being damaged (e.g., due to plasma damage) by the dry etch process.

Additionally, some of the exposed portions 2206, 2208 of the first dielectric layer 116 are removed during the dry etch process, and the amount of material removed in this way is process dependent and is likely not uniform across concurrently fabricated transistor devices (e.g., when processing a wafer that includes multiple transistor devices). This results in uncertainty as to the thickness of the exposed portions 2206, 2208 and reducing thickness uniformity of the exposed portions 2206, 2208.

Figure 23:
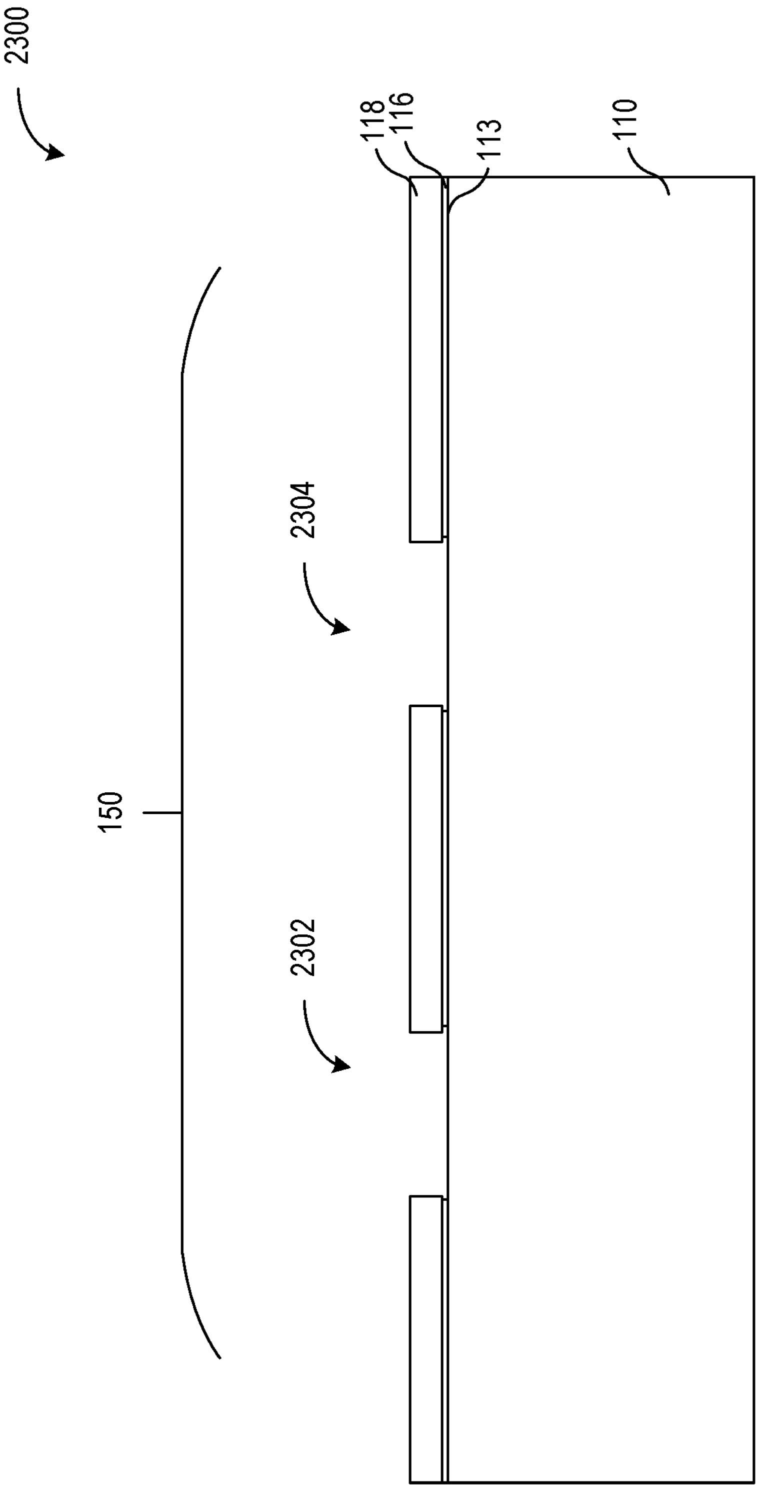

Referring next to step 1810 of FIG. 18 and to FIG. 23, during a stage of fabrication 2300, a wet etch is performed to remove the portions 2206, 2208 of the first dielectric layer 116 that were damaged via exposure to the etch process at step 1808, thereby forming an opening 2302 and an opening 2304 that each extend through the first dielectric layer 116 and the second dielectric layer 118. In one or more embodiments, the wet etch is a patterned wet etch. In one or more other embodiments, the wet etch is performed without using a photolithographic process, and instead forms the openings 2302, 2304 utilizing the existing pattern resulting from the dry etch process used at step 1808.

In one or more embodiments, the portions 2206, 2208 of the first dielectric layer 116 are removed via an anisotropic wet etch process that selectively etches the dielectric material (e.g., oxide material) of the first dielectric layer 116 with a higher etch rate than the dielectric material (e.g., nitride material) of the second dielectric layer 118. As shown, the wet etch may partially undercut the second dielectric layer 118 in the regions of the openings 2302, 2304. The opening 2302 may correspond to the gate channel in which the gate structure is at least partially formed at a subsequent stage of fabrication (e.g., the stage of fabrication 2900 of FIG. 29). The opening 2304 may correspond to the field plate channel 1708 in which the field plate 1704 is formed at a subsequent stage of fabrication (e.g., the stage of fabrication 3500 of FIG. 35).

Removing the portions 2206, 2208 of the first dielectric layer 116 in this way avoids having the portions 2206, 2208 act as a charge carrier trapping centers in the transistor 1701 due to the damage the portions 2206, 2208 received from the dry etch at the step 1808. Removing the portions 2206, 2208 of the first dielectric layer 116 also avoids or reduces thickness non-uniformity in the first dielectric layer 116 attributable to the partial etching of the portions 2206, 2208 during the dry etch at the step 1808.

Figure 24:
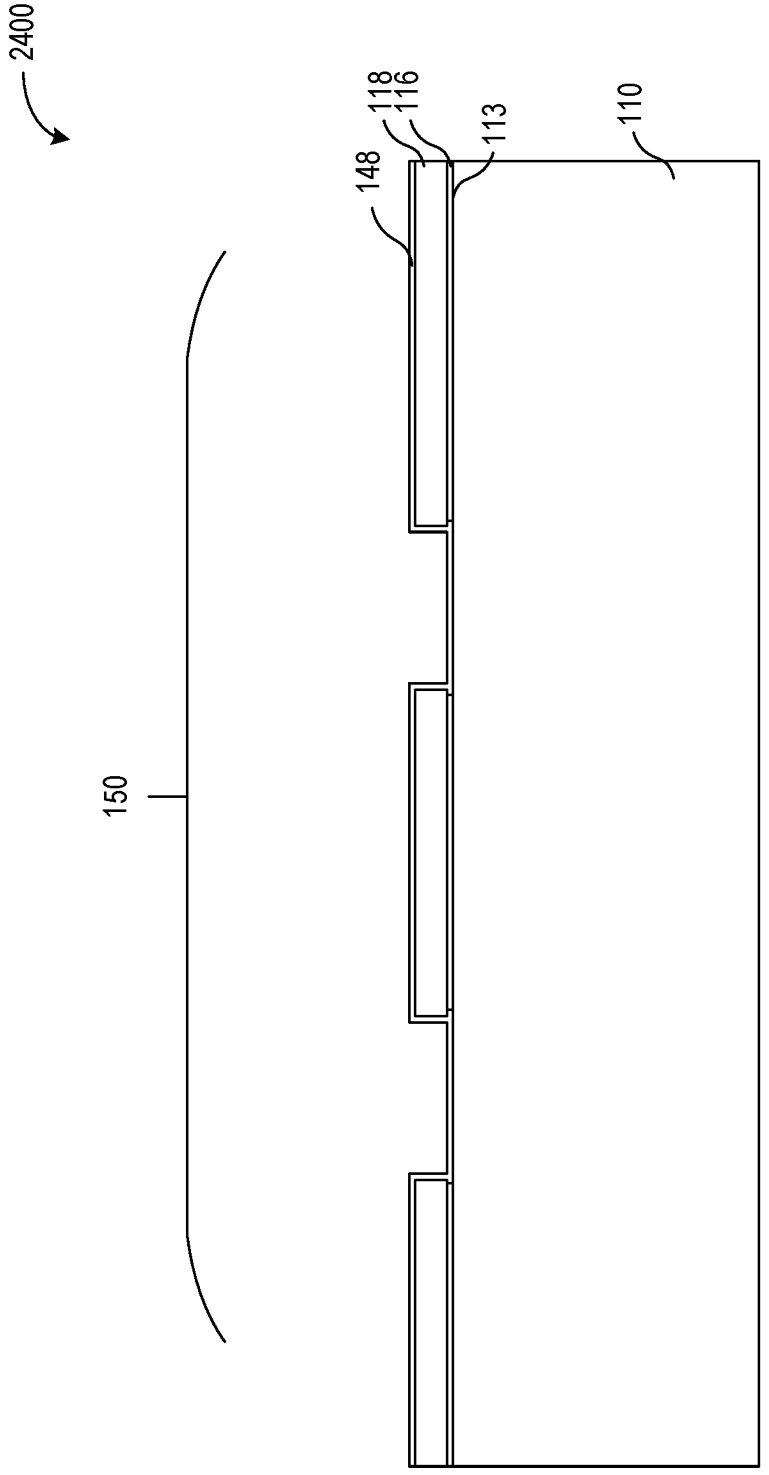

Referring next to step 1812 of FIG. 18 and to FIG. 24, during a stage of fabrication 2400, a first spacer layer 148 is formed over the substrate 110. The first spacer layer 148 may be formed directly on top and side surfaces of the second dielectric layer 118, side surfaces of the first dielectric layer 116, and the surface 113 of the substrate 110 exposed through the openings 2302, 2304. In one or more embodiments, the first spacer layer 148 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via chemical vapor deposition (e.g., LPCVD) as a non-limiting example. In one or more embodiments, the first spacer layer 148 may include an oxide (e.g., $SiO_2$, $ZrO_2$, $HfO_2$, $Al_2O_3$, or $TiO_2$ as non-limiting examples).

Figure 25:
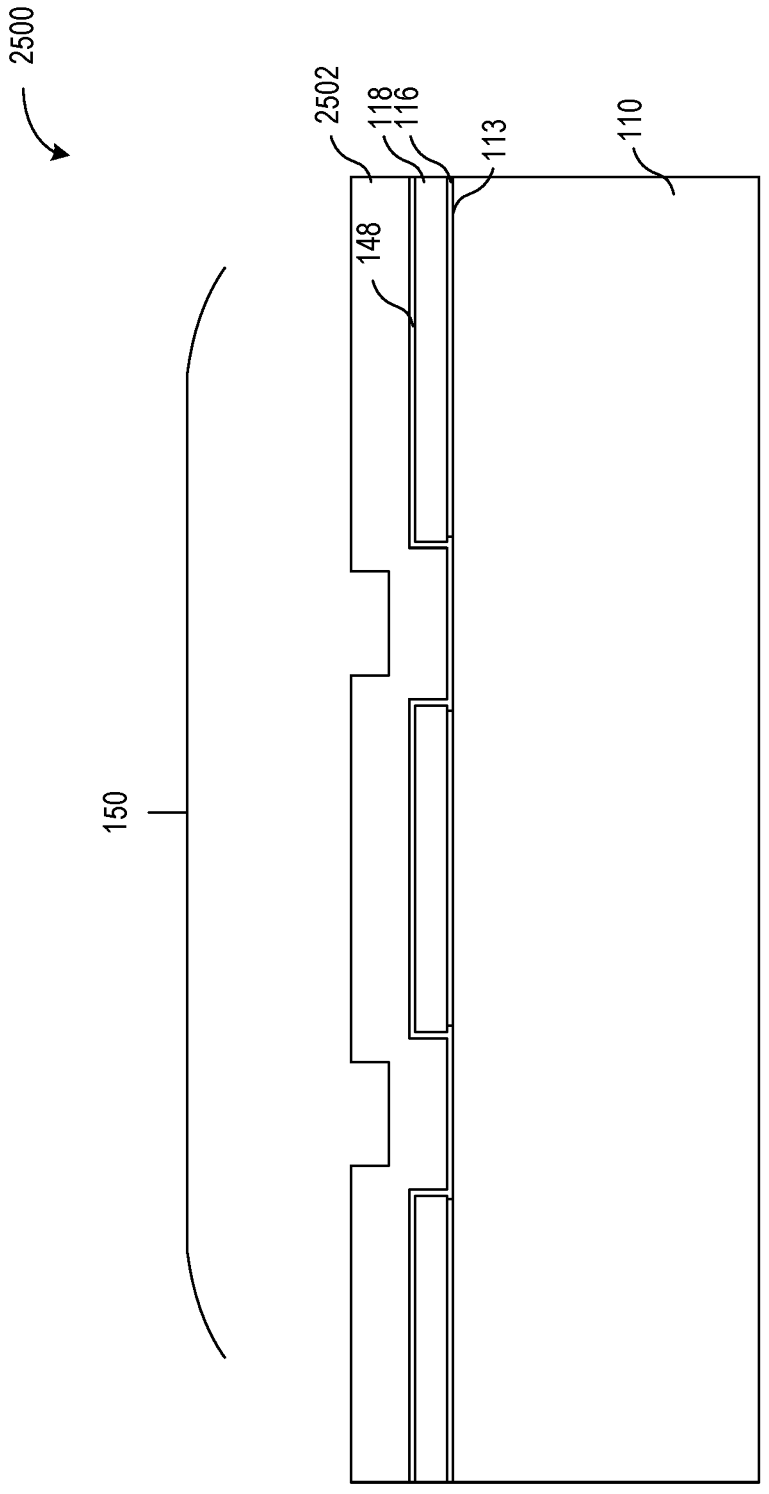

Referring next to step 1814 of FIG. 18 and to FIG. 25, during a stage of fabrication 2500, a second spacer layer 2502 is formed over the substrate 110. The second spacer layer 2502 may be formed directly on surfaces of the first spacer layer 148. In one or more embodiments, the second spacer layer 2502 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via plasma enhanced chemical vapor deposition (e.g., PECVD) as a non-limiting example. In one or more embodiments, the second spacer layer 2502 may include a nitride (e.g., SiN, AlN, SiAlN as non-limiting examples).

Figure 26:
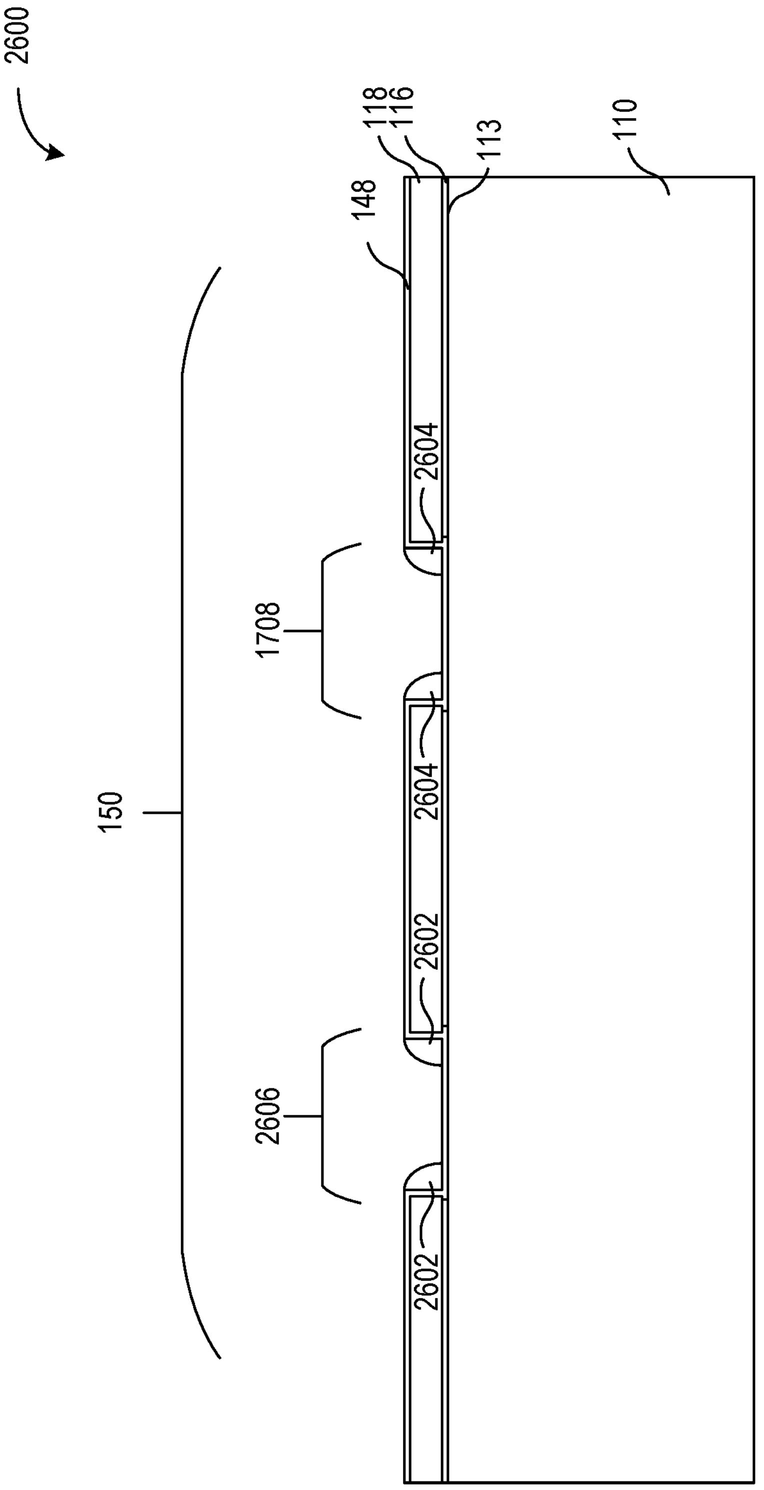

Referring next to step 1816 of FIG. 18 and to FIG. 26, during a stage of fabrication 2600, a dry etch is performed to remove portions of the second spacer layer 2502. The dry etch may be patterned or non-patterned (e.g., a blanket dry etch), in accordance with various embodiments. For example, during the stage of fabrication 2600, an anisotropic dry etch process (e.g., a RIE process or other plasma etching process, as non-limiting examples) is performed to remove portions of the second spacer layer 2502. Portions 2602 of the second spacer layer 2502 remain in the gate channel 2606 and portions 2604 of the second spacer layer 2502 remain in the field plate channel 1708 upon completion of this dry etch process due to the second spacer layer 2502 having greater thickness at edges of the gate channel 2606 and the field plate channel 1708. The first spacer layer 148 may act as an etch stop for this dry etch process, thereby mitigating or preventing damage to the surface 113 of the substrate 110. This results in the exposed portions of the first spacer layer 148 being damaged (e.g., due to plasma damage) by the dry etch process.

Figure 27:
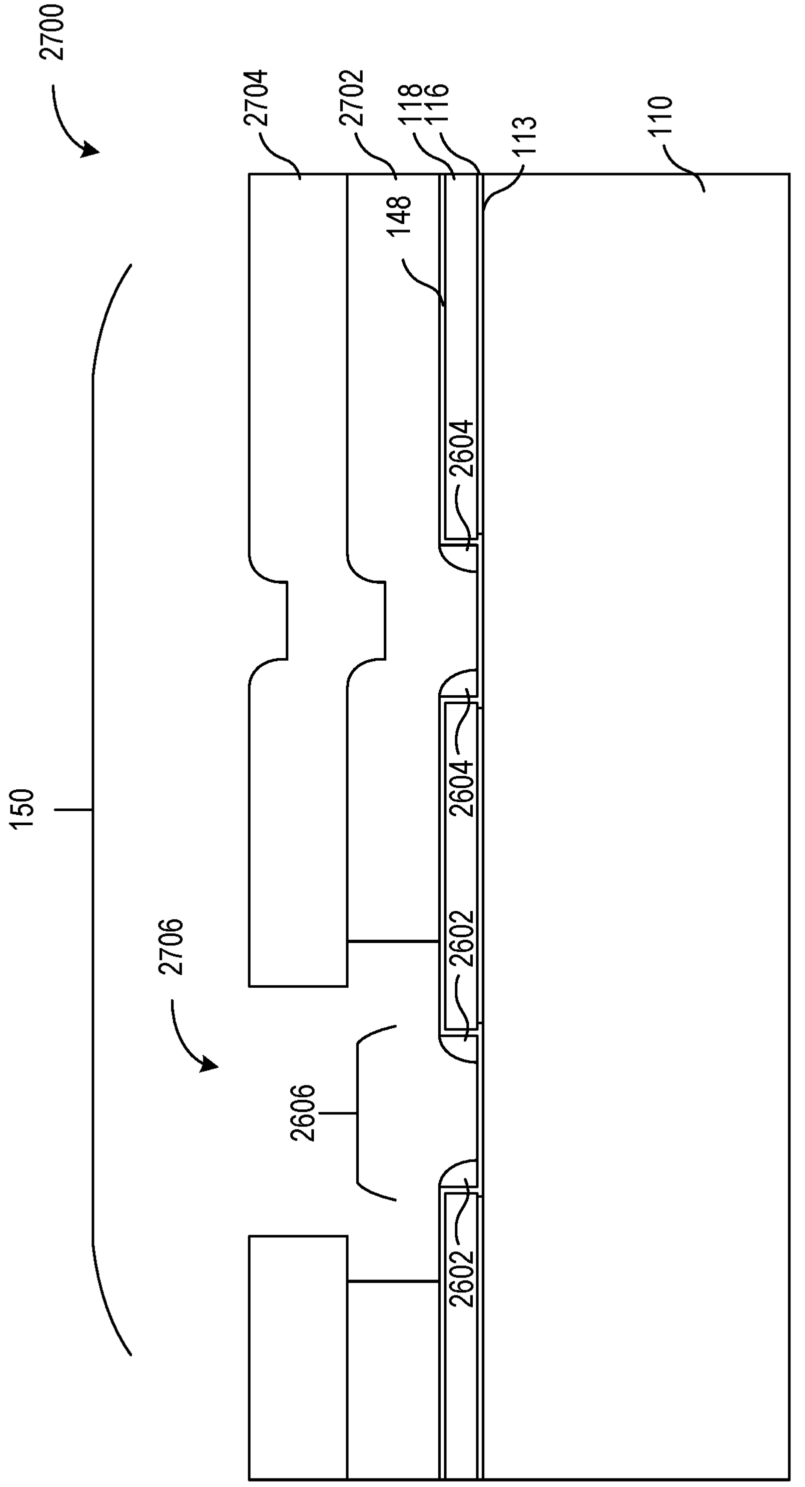

Referring next to step 1818 of FIG. 18 and to FIG. 27, during a stage of fabrication 2700, a first patterned photoresist layer 2702 and a second patterned photoresist layer 2704 are formed over the substrate 110. For example, the first patterned photoresist layer 2702 and the second patterned photoresist layer 2704 may be formed via respective photolithographic processes, each including spin coating photoresist material (e.g., resin) over the substrate 110, exposing the photoresist material to ultraviolet (UV) light through a patterned mask, and baking at a predetermined temperature, and removing portions of the photoresist material (e.g., removing those portions exposed to UV light when using positive photoresist material or removing those portions not exposed to UV light when using negative photoresist material) using a developer solution. An opening 2706 is formed through the first and second photoresist layers 2702, 2704, through which a region (i.e., the "gate channel region") including the gate channel 2606 is exposed.

In one or more embodiments, the first photoresist layer 2702 may be developed concurrently with the second photoresist layer 2704. As shown, the opening in the first photoresist layer 2702 may be wider than the opening in the second photoresist layer 2704, such that the second photoresist layer 2704 overhangs the first photoresist layer 2702 in the region of the opening 2706.

In an example embodiment, the first photoresist layer 2702 has a thickness of around 0.5 μm to around 2 μm, although it should be understood that other suitable thicknesses may be used. In an example embodiment, the second photoresist layer 2704 has a thickness of between around 0.25 μm to around 1.5 μm although other suitable thicknesses may be used.

Figure 28:
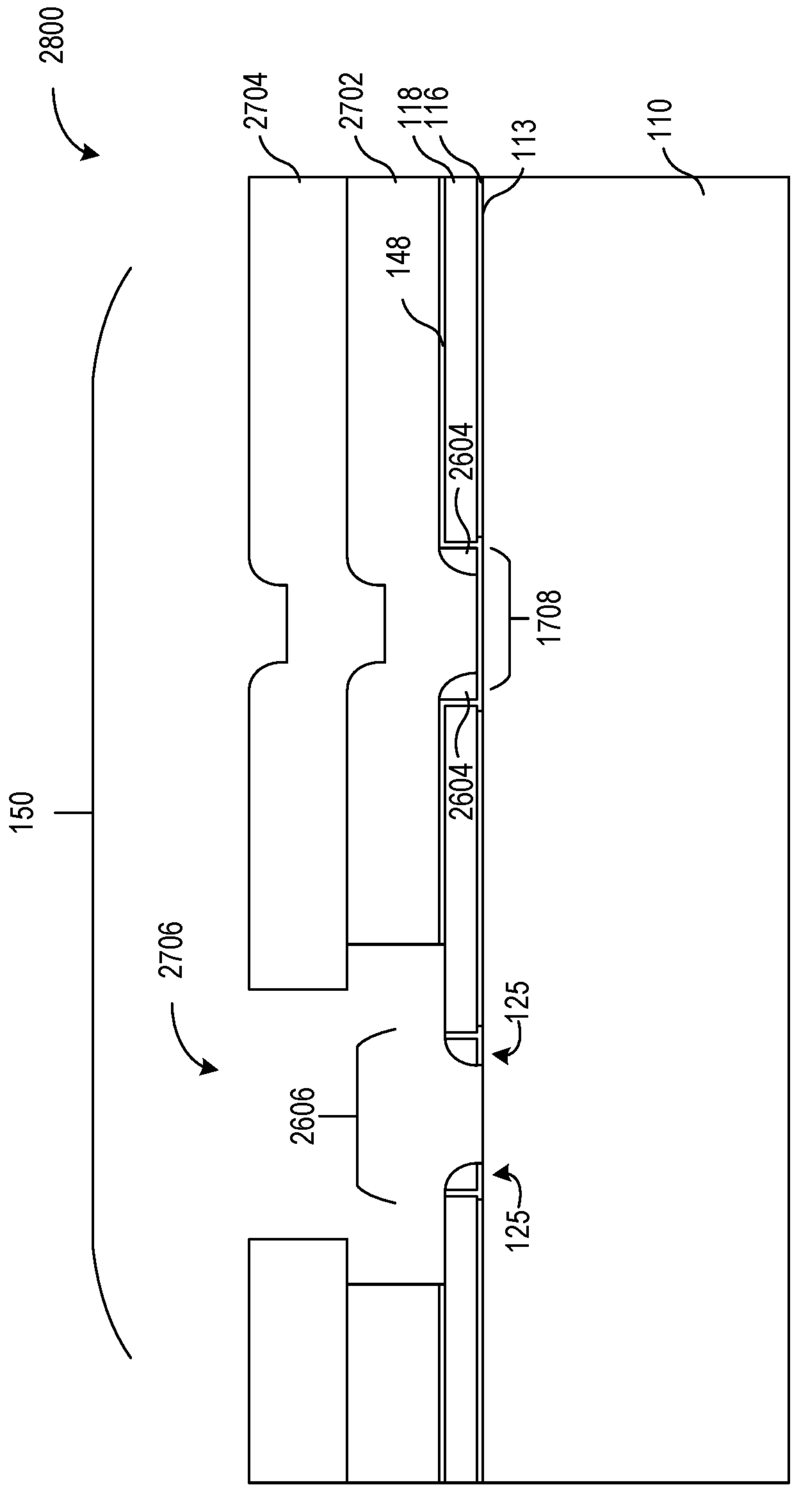

Referring next to step 1820 of FIG. 18 and to FIG. 28, during a stage of fabrication 2800, a wet etch is performed to remove exposed portions of the first spacer layer 148, exposing the surface 113 of the substrate 110 in the gate channel 2606. For example, portions of the first spacer layer 148 that were exposed through the opening 2706 and that were damaged by the dry etch process at the step 1816 are removed via this wet etch process. Some portions of the first spacer layer 148 remain after completion of this wet etch process. For example, remaining portions of the first spacer layer 148 are included in the spacer structures 125 and disposed in direct contact with side walls of the first dielectric layer 116, side walls of the second dielectric layer 118, and the surface 113 of the substrate 110 in the gate channel 2606. For example, other remaining portions of the first spacer layer 148 are disposed on upper surfaces of the second dielectric layer 118 and on side walls of the first and second dielectric layers 116, 118 and the surface 113 of the substrate 110 in the field plate channel 1708. At least some of these remaining portions of the first spacer layer 148 are disposed directly between the second dielectric layer 118 and the surface 113 of the substrate 110, due to filling in the undercut sections of the first dielectric layer 116 at or near the gate channel 2606. Together with the portions 2602 of the second spacer layer 2502, these remaining portions of the first spacer layer 148 form spacer structures 125 in the gate channel 2606.

The width of each spacer structure 125 corresponds to the respective thicknesses of the first spacer layer 148 and the second spacer layer 2502 (e.g., with greater initial thicknesses, at deposition, of the layers 148 and 2502 corresponding to wider spacer structures 125). Thus, the widths of the spacer structures 125 may be set based on the amount of dielectric material deposited when forming each of the first spacer layer 148 and the second spacer layer 2502.

In this way, the gate length of the transistor device 1700 may be adjusted by adjusting the thickness of dielectric material deposited when forming the first spacer layer 148 and the second spacer layer 2502. For example, forming thicker spacer layers 148, 2502 can result in wider spacer structures 125, which can reduce the gate length of the subsequently formed gate structure 128. In one or more embodiments, by forming sufficiently wide spacer structures 125, a gate length of the bottom of gate electrode 128 may be achieved that is not otherwise achievable using only conventional photolithographic techniques.

Figure 29:
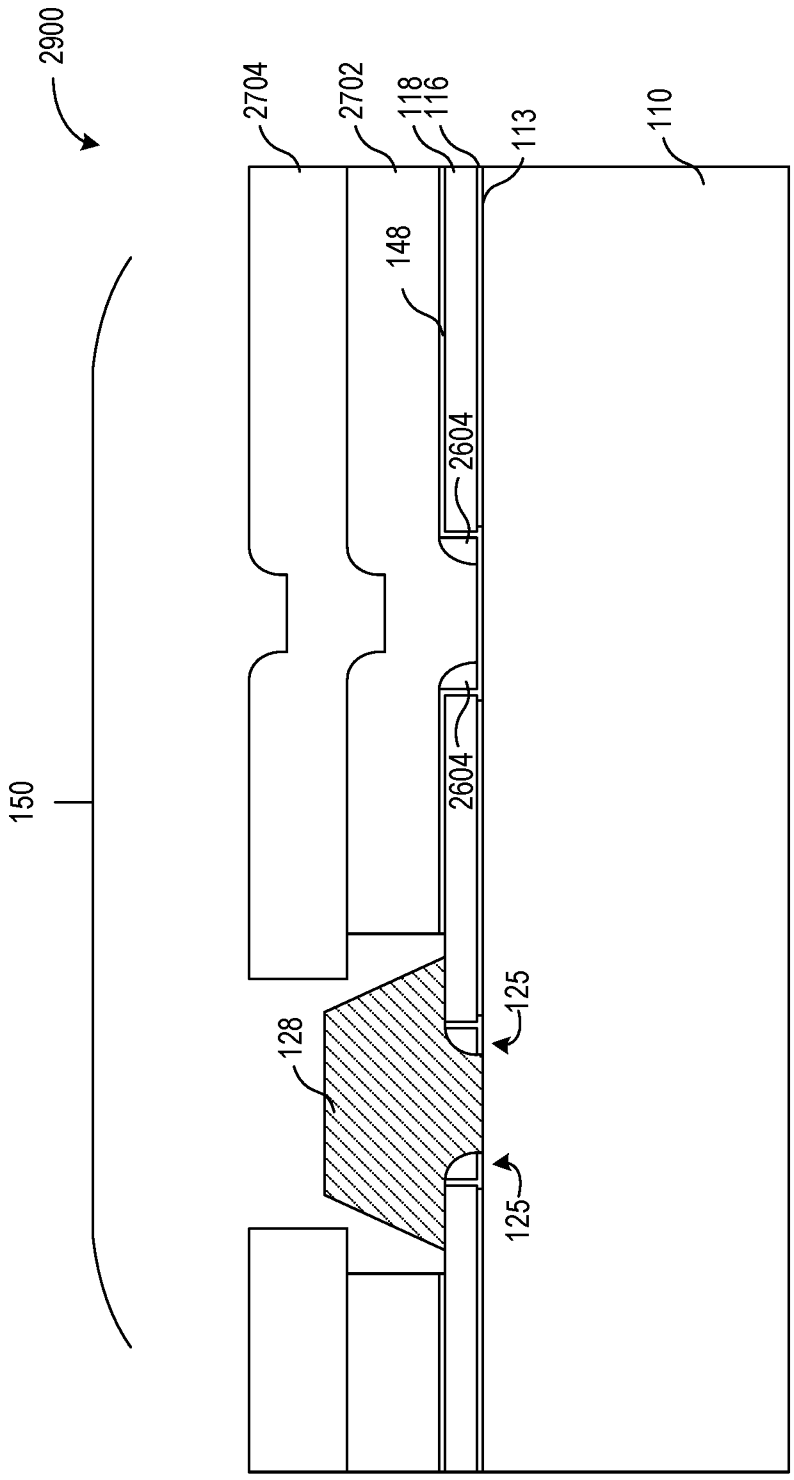

Referring next to step 1822 of FIG. 18 and to FIG. 29, at a stage of fabrication 2900, a gate structure 128 is formed through the opening 2706 that extends through the first photoresist layer 2702 and the second photoresist layer 2704. The gate structure 128 may be electromagnetically coupled to the channel 108 through the upper surface 113 of the substrate 110 and the barrier layer 112. During operation of the transistor device 100, changes to the electric potential of gate structure 128 may shift the quasi-Fermi level for the barrier layer 112 compared to the quasi-Fermi level for the channel layer 106 and thereby modulate the electron concentration in the channel 108 within the portion of the substrate 110 under the gate structure 128. One or more aspects of the gate structure 128 in the stage of fabrication 2900 may be similar to those of the gate structure 128 in the stage of fabrication 1300 of FIG. 13, as described above, and such aspects are not repeated here for sake of brevity.

Figure 30:
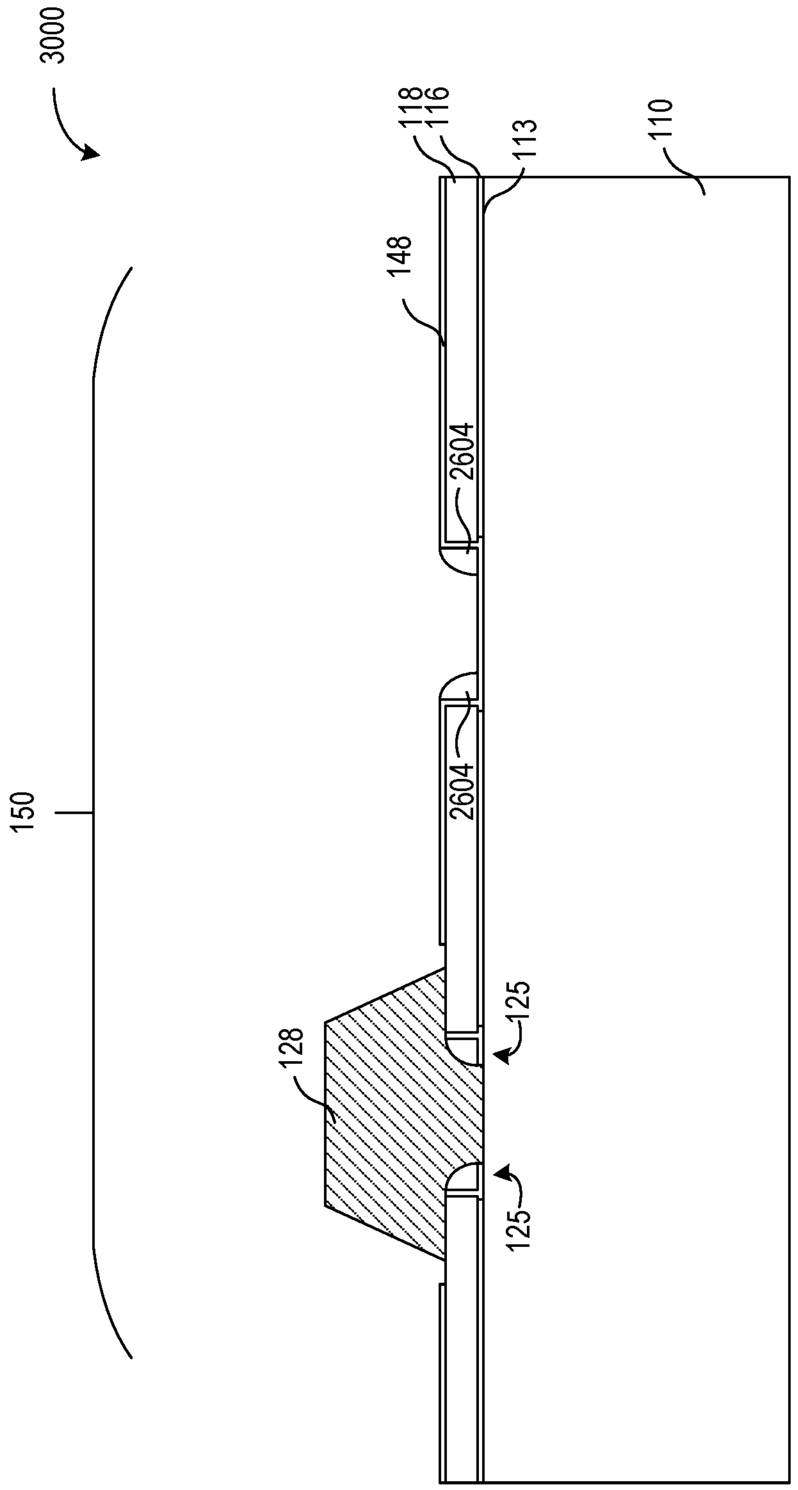

Referring next to step 1824 of FIG. 18 and to FIG. 30, at a stage of fabrication 3000, the first photoresist layer 2702, the second photoresist layer 2704, and the second portion of gate metal deposited on the surface(s) of the second photoresist layer 2704 are concurrently removed via a lift-off process. For example, in the lift-off process, a photoresist striper (e.g., a solvent such as acetone, 1-methyl-2-pyrrolidone, or dimethyl sulfoxide) may be applied to remove the first photoresist layer 2702 and the second photoresist layer 2704, which detaches (i.e., "lifts-off") the excess gate metal on the surface of the second photoresist layer 2704.

While a bi-layer lift-off process has been described in connection with steps 1818, 1820, 1822, 1824 of FIG. 18 and stages of fabrication 2700, 2800, 2900, 3000 of FIGS. 27-30, it should be understood that this is intended to be illustrative and not limiting. For example, other photolithographic processes (e.g., using a single photoresist layer that is developed with an undercut profile) may instead be used when forming the gate structure 128 in one or more other embodiments.

Figure 31:
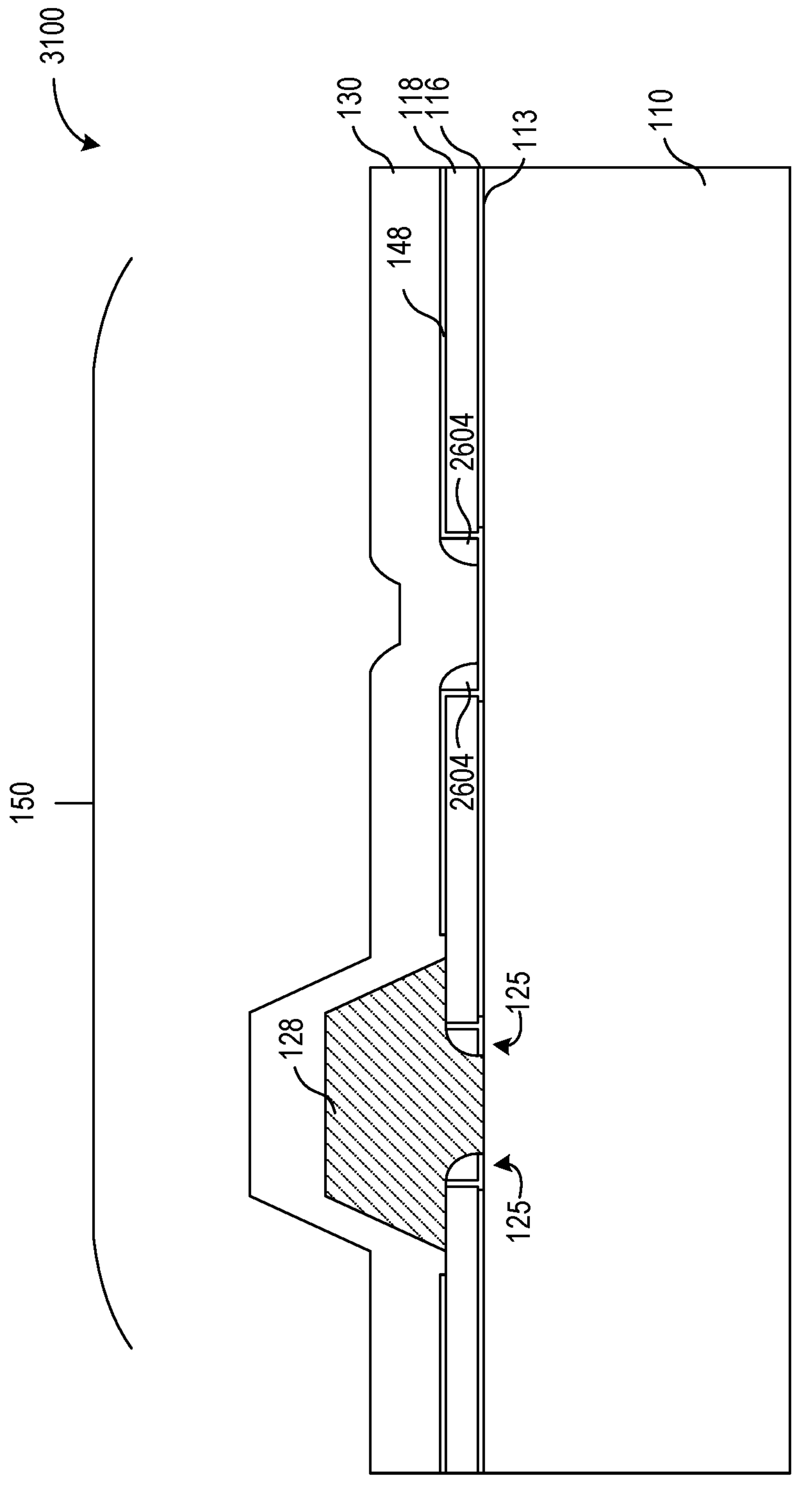

Referring next to step 1826 of FIG. 18 and to FIG. 31, at the stage of fabrication 3100, an ILD layer 130 is formed over the substrate 110 (e.g., in contact with surfaces of each of the second dielectric layer 118 and the gate structure 128). In one or more embodiments, the ILD layer 130 has a thickness in a range of about 500 Angstroms to about 10,000 Angstroms, although other suitable thicknesses may be used. The ILD layer 130 may be formed from silicon nitride, silicon oxide, silicon oxynitride or other suitable dielectric materials, as non-limiting examples.

Figure 32:
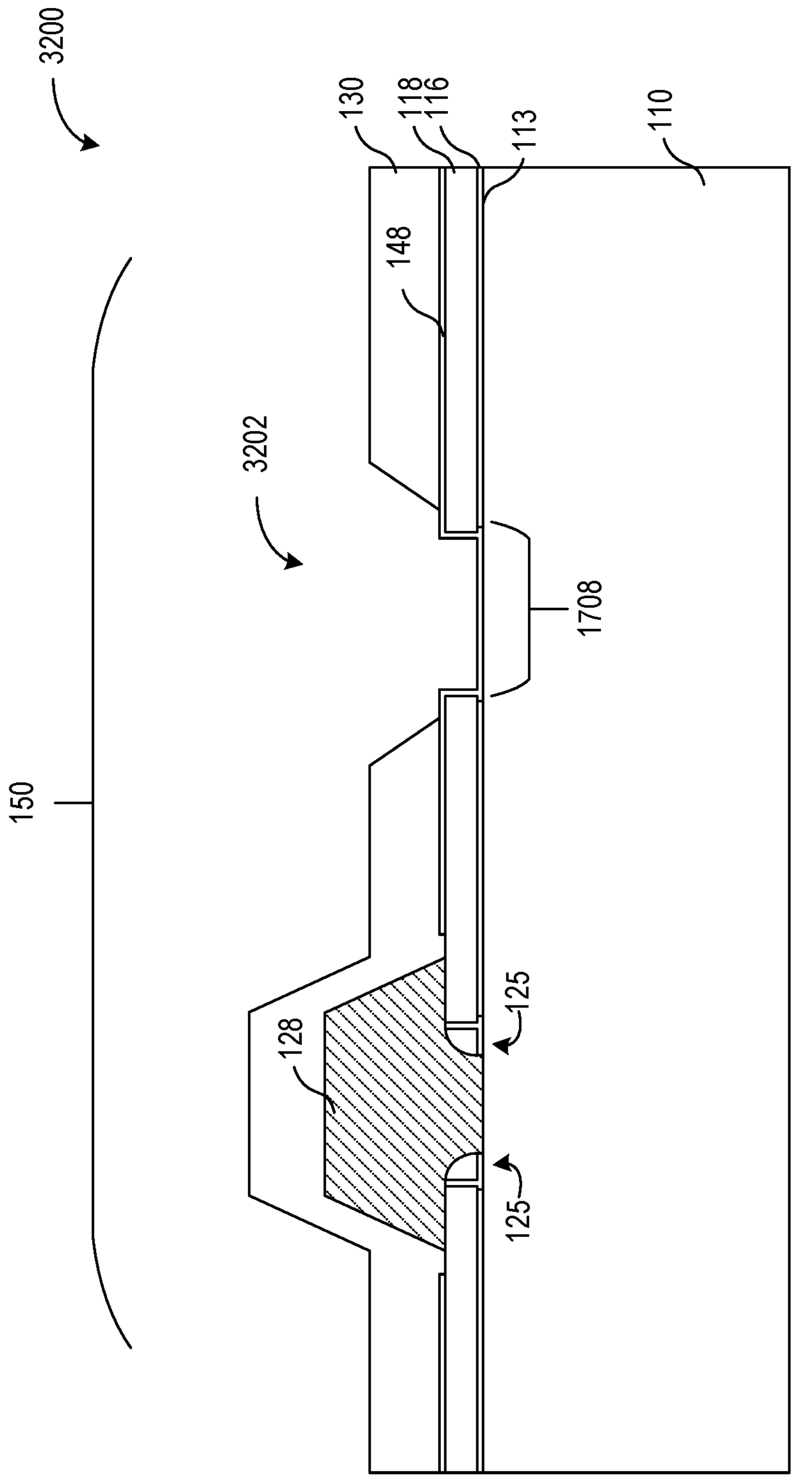

Referring next to step 1828 of FIG. 18 and to FIG. 32, at a stage of fabrication 3200, a patterned dry etch is performed to form an opening 3202 in the ILD layer 130. For example, during the stage of fabrication 3200, an anisotropic dry etch process (e.g., a RIE process or other plasma etching process, as non-limiting examples) may be performed to remove portions of the ILD layer 130 to form the opening 3202. The opening 3202 may overlap the field plate channel 1708. The first spacer layer 148 may act as an etch stop for this dry etch process, thereby mitigating or preventing damage to the surface 113 of the substrate 110. This results in the exposed portions of the first spacer layer 148 being damaged (e.g., due to plasma damage) by the dry etch process. In one or more embodiments, the ILD layer 130 is formed from a material having a similar etch rate as the material of the second spacer layer 2502, such that the remaining portions 2604 of the second spacer layer 2502 disposed in the field plate channel 1708 are removed along with the portions of the ILD layer 130 by this dry etch process.

Figure 33:
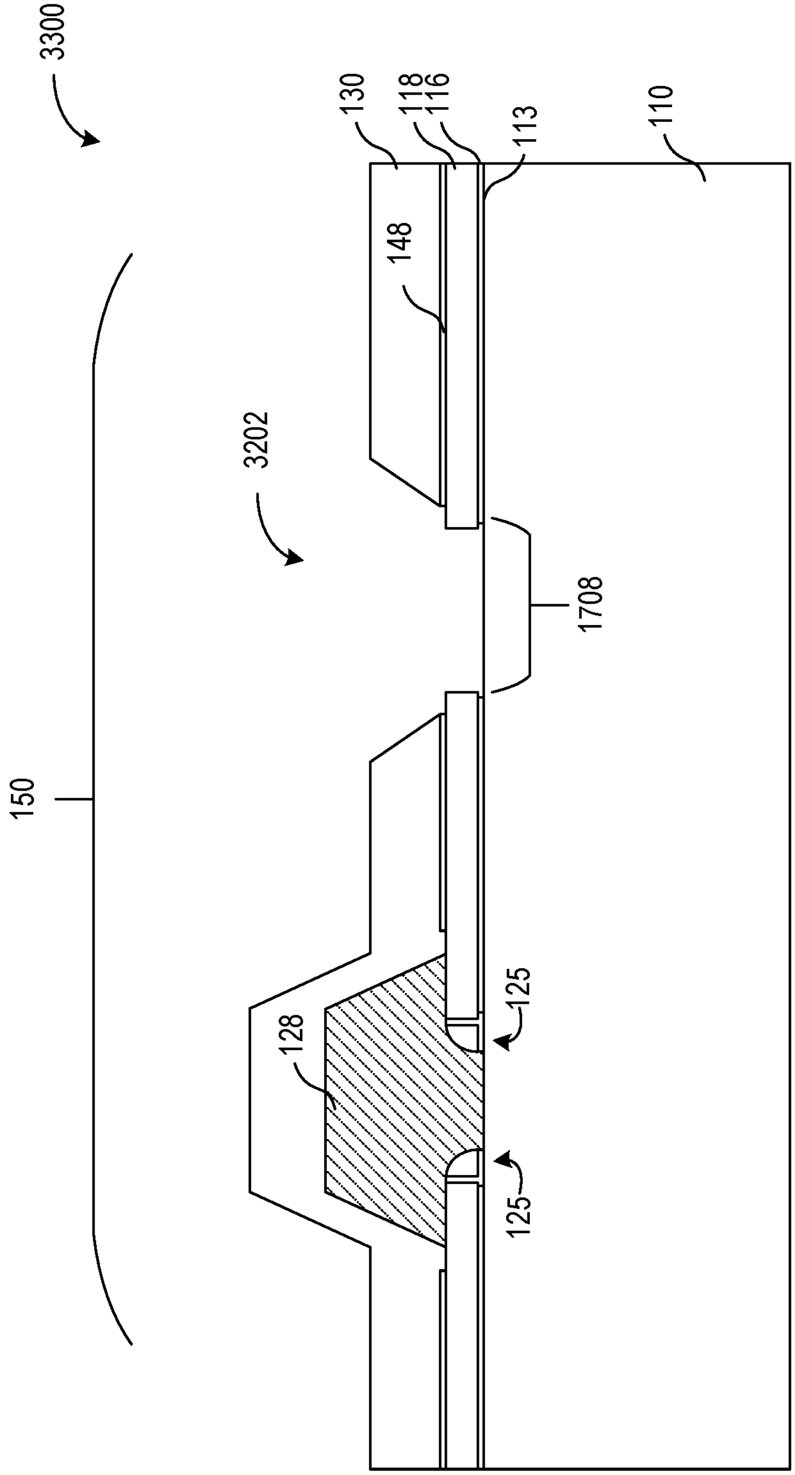

Referring a next to step 1830 of FIG. 18 and to FIG. 33, at a stage of fabrication 3300, a wet etch is performed to remove exposed portions of the first spacer layer 148 (i.e., exposed through the opening 3202). For example, exposed portions of the first spacer layer 148 that were damaged by the dry etch process at the step 1828 (those portions located in the field plate channel 1708) are removed via this wet etch process. Some portions of the first spacer layer 148 remain upon completion of this wet etch process, with such portions being disposed on upper surfaces of the second dielectric layer 118.

Figure 34:
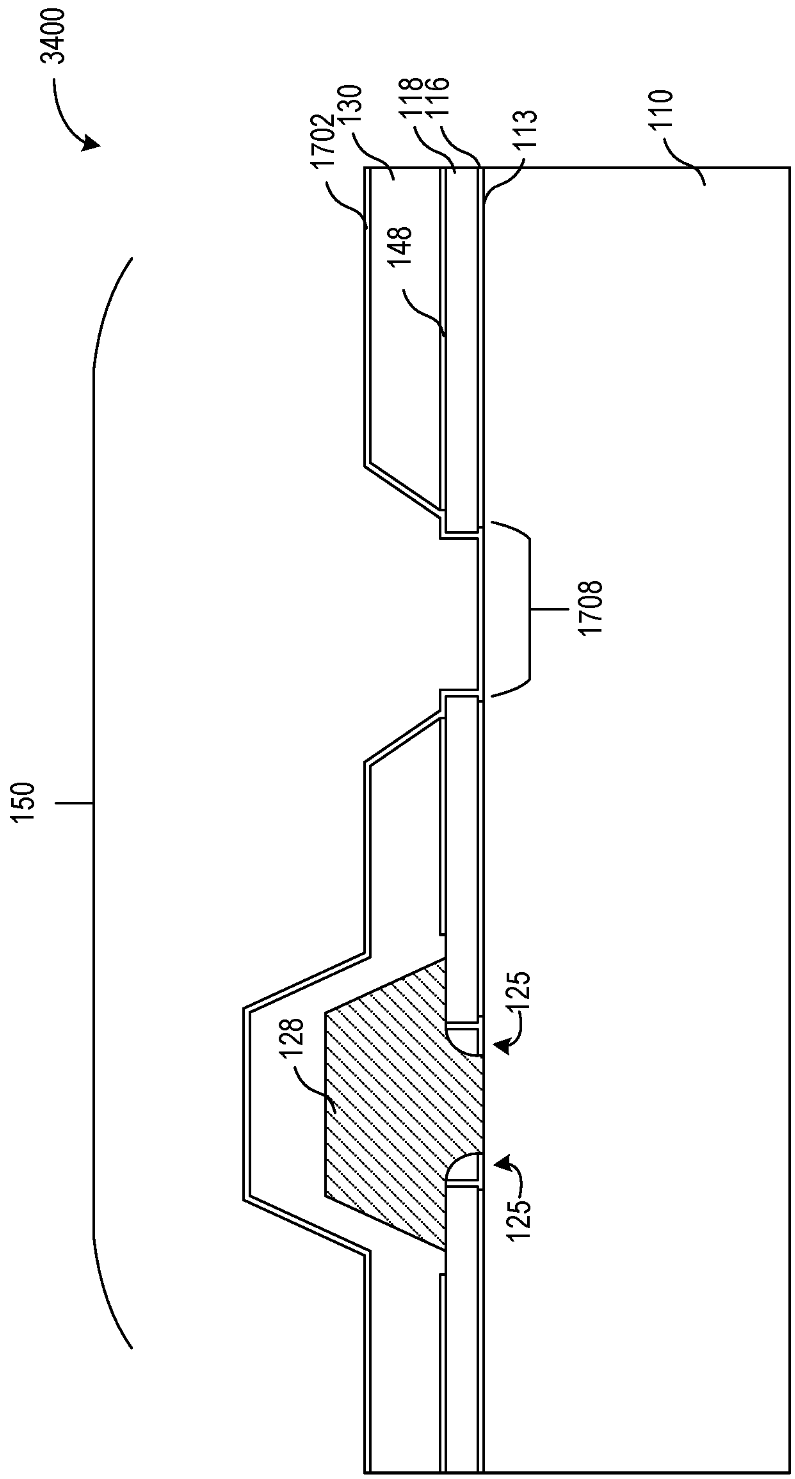

Referring a next to step 1832 of FIG. 18 and to FIG. 34, at a stage of fabrication 3400, a third dielectric layer 1702 is formed over the substrate 110. The third dielectric layer 1702 may be formed directly on surfaces of the ILD layer 130, on top and side surfaces of the second dielectric layer 118 in the field plate channel 1708, on side surfaces of the first dielectric layer 116 in the field plate channel 1708, and on the surface 113 of the substrate 110 in the field plate channel 1708. In one or more embodiments, the third dielectric layer 1702 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via PECVD or LPCVD as non-limiting examples. The third dielectric layer 1702 may have a thickness range of around 30 Angstroms to around 5000 Angstroms.

Figure 35:
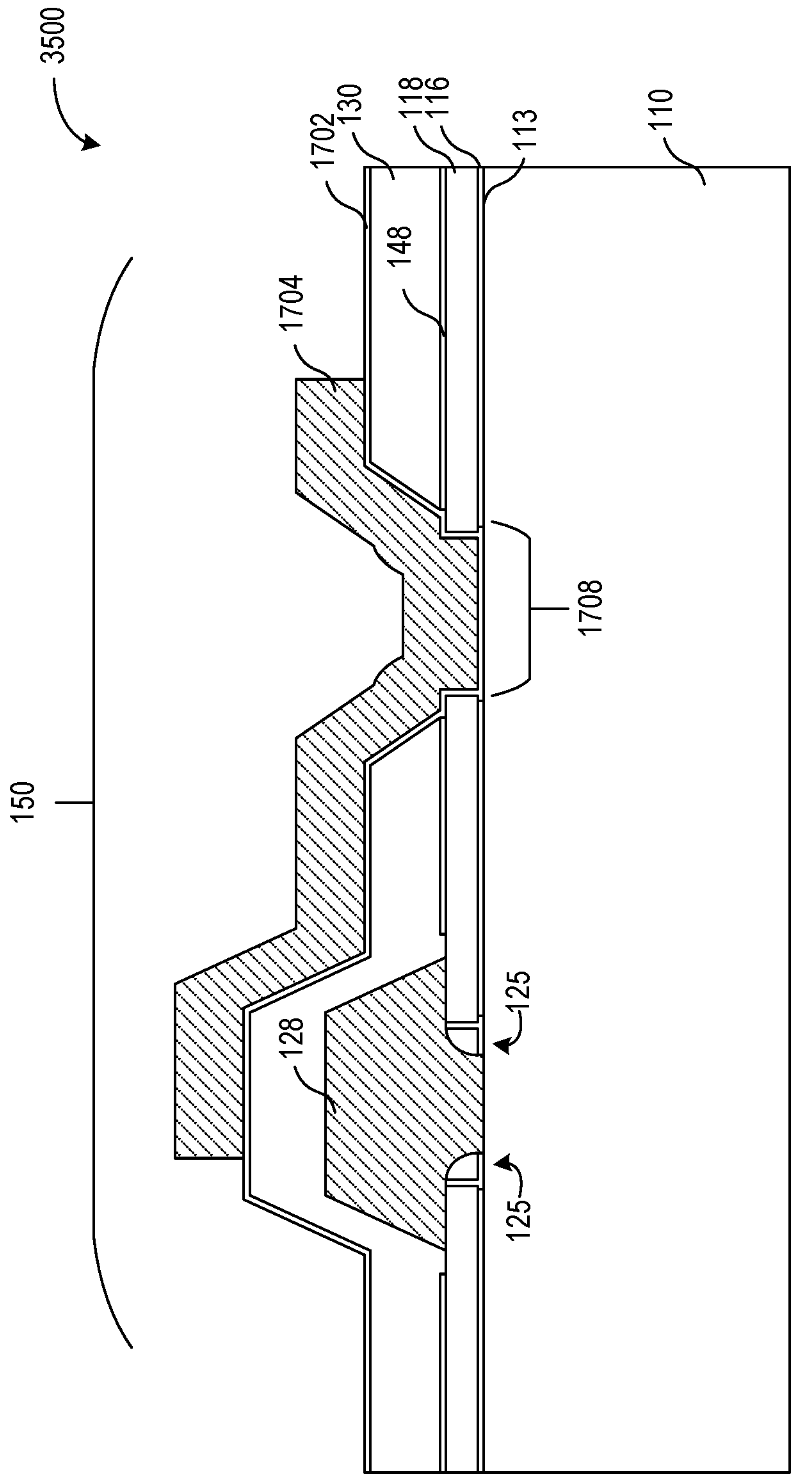

Referring a next to step 1834 of FIG. 18 and to FIG. 35, at a stage of fabrication 3500, a field plate 1704 is formed on the third dielectric layer 1702. For example, a patterned conductive layer may be formed (e.g., deposited via sputtering, evaporation, or chemical vapor deposition as non-limiting examples, then patterned using a suitable photolithographic process) over the substrate 110 to form the field plate 1704. For example, the conductive layer may include electrically conductive material, such as TiW, TiWN, WSi, or other suitable materials. The conductive layer may have a thickness in a range of about 100 Angstroms to about 5,000 Angstroms, although other suitable thicknesses may be used.

Separating the field plate 1704 from the surface 113 of the substrate 110 using a dielectric layer that is formed after formation of the field plate channel 1708 (i.e., the third dielectric layer 1702) ensures that this dielectric material has not been damaged by the dry etch process used at the step 1828 to form the opening 3202 in the ILD layer 130 that overlaps the field plate channel 1708. Removal and replacement of damaged dielectric material in the field plate channel 1708 reduces the likelihood of charge carrier traps being present in the field plate channel 1708, which advantageously improves performance of the transistor device 1700. This approach also provides better thickness uniformity of the dielectric material that separates the field plate 1704 from the surface 113 in the field plate channel 1708, which advantageously reduces process variation with respect to the amount of separation between the field plate 1704 and the surface 113 in the field plate channel 1708 and advantageously improves the stability of the gate threshold voltage of the transistor device 1700.

It should be understood that additional processing steps may be performed to fabricate the transistor device 1700, which may be performed before (e.g., ohmic implantation processes) or after performance of the method 1800 of FIG. 18. Such processing steps may include the deposition and patterning of additional dielectric layers (e.g., dielectric layer 138 or other applicable dielectric layers) and metal layers (e.g., the interconnect layers 140, 141, or other applicable metal layers) as non-limiting examples.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter. Furthermore, the term "amplifier" used herein should be understood to refer to a "power amplifier" unless noted otherwise.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a transistor device, the method comprising:

providing a semiconductor substrate;

forming a first dielectric layer on the semiconductor substrate;

forming a second dielectric layer on the first dielectric layer;

forming a gate channel by:

performing a first patterned dry etch to form a first opening in the second dielectric layer; and performing a first wet etch to form a second opening in the first dielectric layer;

forming dielectric spacer structures in the gate channel, wherein forming the dielectric spacer structures comprises:

forming a first layer over the semiconductor substrate and in the gate channel;

forming a second layer on the first layer; and etching to remove portions of the first layer and portions of the second layer;

forming a gate structure disposed at least partially in the gate channel and in contact with surfaces of the semiconductor substrate, the second dielectric layer, and the dielectric spacer structures;

forming an interlayer dielectric layer on the gate structure and the second dielectric layer; and forming a field plate over the interlayer dielectric layer, wherein at least a portion of the field plate overlaps the gate structure, wherein:

performing the first patterned dry etch further forms a third opening in the second dielectric layer, performing the first wet etch further forms a fourth opening in the first dielectric layer overlapping the third opening to expose a surface of the semiconductor substrate, the third opening and the fourth opening correspond to a field plate channel, and the field plate is at least partially disposed in the field plate channel.

2. The method of claim 1, wherein the first layer comprises oxide material and the second layer comprises nitride material.

3. The method of claim 1, wherein etching to remove portions of the first layer and portions of the second layer comprises:

performing a dry etch to remove the portions of the second layer; and performing a second wet etch to remove the portions of the first layer.

4. The method of claim 1, wherein etching to remove portions of the first layer and portions of the second layer comprises:

performing a dry etch to remove the portions of the second layer;

forming a first patterned photoresist layer over the semiconductor substrate having a fifth opening overlapping the gate channel;

forming a second patterned photoresist layer over the semiconductor substrate having a sixth opening overlapping the gate channel; and after forming the first patterned photoresist layer and the second patterned photoresist layer, performing a second wet etch to remove the portions of the first layer.

5. The method of claim 4, wherein forming the first layer further includes forming the first layer in the field plate channel.

6. The method of claim 4, further comprising:

performing a second patterned dry etch to form a seventh opening in the interlayer dielectric layer through which a portion of the first layer is exposed.

7. The method of claim 6, further comprising:

before forming the field plate, performing a third wet etch to remove portions of the first layer exposed through the seventh opening; and before forming the field plate, forming a third dielectric layer disposed on surfaces of the interlayer dielectric layer and, in the field plate channel, the surface of the semiconductor substrate.

8. The method of claim 1, wherein forming the gate structure comprises:

forming a first patterned photoresist layer over the semiconductor substrate having a fifth opening overlapping the gate channel;

forming a second patterned photoresist layer over the semiconductor substrate having a sixth opening overlapping the gate channel; and depositing metal over the semiconductor substrate, a first portion of the metal being deposited through the fifth opening and the sixth opening to form the gate structure, and a second portion of the metal being deposited on surfaces of the first patterned photoresist layer.

9. The method of claim 8, further comprising:

removing the second portion of the metal via concurrent removal of the first patterned photoresist layer and the second patterned photoresist layer.

* * * * *